(12) United States Patent
Morton et al.

(10) Patent No.: US 10,957,660 B2
(45) Date of Patent: Mar. 23, 2021

(54) LAND GRID ARRAY PATTERNS FOR MODULAR ELECTRONICS PLATFORMS AND METHODS OF PERFORMING THE SAME

(71) Applicant: Hand Held Products, Inc., Fort Mill, SC (US)

(72) Inventors: Bruce Morton, Lake Stevens, WA (US); Pavel Nikitin, Seattle, WA (US); David Gilpin, Everett, WA (US)

(73) Assignee: HAND HELD PRODUCTS, INC., Fort Mill, SC (US)

( * ) Notice: Subject to any disclaimer, the term of this patent is extended or adjusted under 35 U.S.C. 154(b) by 0 days.

(21) Appl. No.: 16/727,550

(22) Filed: Dec. 26, 2019

(65) Prior Publication Data

US 2020/0135672 A1  Apr. 30, 2020

Related U.S. Application Data

(63) Continuation of application No. 16/151,577, filed on Oct. 4, 2018, now Pat. No. 10,559,545.

(60) Provisional application No. 62/568,297, filed on Oct. 4, 2017.

(51) Int. Cl.
*H01L 23/66* (2006.01)
*H01L 23/00* (2006.01)
*H01L 23/538* (2006.01)

(52) U.S. Cl.
CPC .......... *H01L 23/66* (2013.01); *H01L 23/5383* (2013.01); *H01L 24/33* (2013.01); *H01L 2223/6677* (2013.01); *H01L 2224/1403* (2013.01); *H01L 2924/14* (2013.01); *H01L 2924/1431* (2013.01); *H01L 2924/1433* (2013.01); *H01L 2924/1434* (2013.01); *H01L 2924/14511* (2013.01); *H01L 2924/15313* (2013.01)

(58) Field of Classification Search
CPC combination set(s) only.
See application file for complete search history.

(56) References Cited

U.S. PATENT DOCUMENTS

| | | | |
|---|---|---|---|
| 9,531,425 | B2 | 12/2016 | McCormack et al. |
| 2014/0169486 | A1* | 6/2014 | McCormack ......... G06F 1/1626 375/259 |
| 2017/0025334 | A1* | 1/2017 | van Gemert ........ H01L 21/4882 |
| 2018/0182735 | A1 | 6/2018 | Leuten et al. |

OTHER PUBLICATIONS

Notice of Allowance and Fees Due (PTOL-85) dated Sep. 30, 2019 for U.S. Appl. No. 16/151,577.

* cited by examiner

*Primary Examiner* — Jasmine J Clark
(74) *Attorney, Agent, or Firm* — Alston & Bird LLP

(57) ABSTRACT

Provided are methods, systems, and apparatuses related to modular electronics platforms for mobile computing devices. One such apparatus may include a system on module (SOM) having a first surface that is configured to be coupled electrically to one or more chipsets. The apparatus may include a land grid array (LGA) disposed on a second surface of the SOM. The LGA may include one or more center anchor pads, one or more corner anchor pads, a digital signal array, one or more communications pads, and one or more ground pads. The various pads of the LGA may be configured to be coupled to one or more pads or pins disposed on a surface of a main logic board (MLB).

20 Claims, 15 Drawing Sheets

Section A-A'

1000

1002
forming one or more MLB center anchor pads on a first surface of the MLB, wherein the one or more MLB center anchor pads are configured to be coupled to one or more LGA center anchor pads disposed on a second surface of an SOM

1004
forming one or more MLB corner anchor pads on the first surface of the MLB, wherein the one or more MLB corner anchor pads are configured to be coupled to one or more LGA corner anchor pads disposed on the second surface of the SOM

1006
forming one or more MLB digital signal pads on the first surface of the MLB, wherein the one or more MLB digital signal pads are configured to be coupled to one or more LGA digital signal pads disposed on the second surface of the SOM

1008
forming one or more MLB communications pads on the first surface of the MLB, wherein the one or more MLB communications pads are configured to be coupled to one or more LGA communications pads disposed on the second surface of the SOM

1010
forming one or more MLB ground pads on the first surface of the MLB, wherein the one or more MLB ground pads are configured to be coupled to one or more LGA ground pads disposed on the second surface of the SOM

FIG. 10

LAND GRID ARRAY PATTERNS FOR MODULAR ELECTRONICS PLATFORMS AND METHODS OF PERFORMING THE SAME

CROSS-REFERENCE TO RELATED APPLICATIONS

The present application is a continuation of and claims priority to U.S. application Ser. No. 16/151,577 filed on Oct. 4, 2018 and titled LAND GRID ARRAY PATTERNS FOR MODULAR ELECTRONICS PLATFORMS AND METHODS OF PERFORMING THE SAME, now U.S. Pat. No. 10,559,545, which claims priority to U.S. Provisional Patent Application No. 62/568,297, filed Oct. 4, 2017 and entitled LAND GRID ARRAY PATTERNS FOR MODULAR ELECTRONICS PLATFORMS AND METHODS OF PERFORMING THE SAME, the entire contents of which are incorporated in their entireties herein by reference.

BACKGROUND

Mobile computing devices such as mobile computers and smartphones implement multi-purpose technologies that are useful for performing a wide variety of tasks. Typically, the electronic modules within these devices do not provide adequate preventative mechanism to reduce environmental risks, such as the stress induced to these electronic modules when users drop these devices on hard surfaces.

Applicants have identified a number of deficiencies and problems associated with existing devices. Through applied effort, ingenuity, and innovation, many of these identified problems have been solved by developing solutions that are included in embodiments of the present disclosure, many examples of which are described in detail herein.

SUMMARY

The present disclosure relates to an apparatus for providing a modular electronics platform for a mobile computing device. The apparatus may include a system on module (SOM) comprising a first surface and a second surface opposite the first surface. The first surface of the SOM may be configured to be coupled electrically to one or more chipsets. Further, the apparatus may include a land grid array (LGA) disposed on the second surface of the SOM. The LGA may include one or more center anchor pads disposed on the second surface of the SOM, one or more corner anchor pads disposed on the second surface of the SOM, a digital signal array disposed on the second surface of the SOM, one or more communications pads disposed on the second surface of the SOM, and one or more ground pads disposed on the second surface of the SOM. In some embodiments, the one or more center anchor pads may be configured to be coupled to one or more main logic board (MLB) center anchor pads disposed on a surface of an MLB, the one or more corner anchor pads may be configured to be coupled to one or more MLB corner anchor pads disposed on the surface of the MLB, the digital signal array may be configured to be coupled to one or more MLB digital signal pads disposed on the surface of the MLB, the one or more communications pads may be configured to be coupled to one or more MLB communications pads disposed on the surface of the MLB, and the one or more ground pads may be configured to be coupled to one or more MLB ground pads disposed on the surface of the MLB.

The present disclosure further relates to an apparatus for providing a modular electronics platform for a mobile computing device. The apparatus may include a main logic board (MLB) comprising a first surface, one or more MLB center anchor pads disposed on the first surface of the MLB, one or more MLB corner anchor pads disposed on the first surface of the MLB, one or more MLB digital signal pads disposed on the first surface of the MLB, one or more MLB communications pads disposed on the first surface of the MLB, and one or more MLB ground pads disposed on the first surface of the MLB. The one or more MLB center anchor pads may be configured to be coupled to one or more land grid array (LGA) center anchor pads disposed on a second surface of a system on module (SOM). The one or more MLB corner anchor pads may be configured to be coupled to one or more LGA corner anchor pads disposed on the second surface of the SOM. The one or more MLB digital signal pads may be configured to be coupled to one or more LGA digital signal pads disposed on the second surface of the SOM. The one or more MLB communications pads may be configured to be coupled to one or more LGA communications pads disposed on the second surface of the SOM. The one or more MLB ground pads may be configured to be coupled to one or more LGA ground pads disposed on the second surface of the SOM.

The present disclosure further relates to a system for providing a modular electronics platform for a mobile computing device. The system may include a system on module (SOM) comprising a first SOM surface and a second SOM surface opposite the first SOM surface. The first SOM surface may be configured to be coupled electrically to one or more chipsets. Further, the system may include a land grid array (LGA) disposed on the second SOM surface. The LGA may include one or more LGA center anchor pads disposed on the second SOM surface, one or more LGA corner anchor pads disposed on the second SOM surface, one or more LGA digital signal pads disposed on the second SOM surface, one or more LGA communications pads disposed on the second SOM surface, and one or more LGA ground pads disposed on the second SOM surface. Further, the system may include a main logic board (MLB) comprising an MLB surface, one or more MLB center anchor pads disposed on the MLB surface, one or more MLB corner anchor pads disposed on the MLB surface, one or more MLB digital signal pads disposed on the MLB surface, one or more MLB communications pads disposed on the MLB surface, and one or more MLB ground pads disposed on the MLB surface. The one or more MLB center anchor pads may be configured to be coupled to the one or more LGA center anchor pads, the one or more MLB corner anchor pads may be configured to be coupled to the one or more LGA corner anchor pads, the one or more MLB digital signal pads may be configured to be coupled to the one or more LGA digital signal pads, the one or more MLB communications pads may be configured to be coupled to the one or more LGA communications pads, and the one or more MLB ground pads may be configured to be coupled to the one or more LGA ground pads.

The present disclosure further relates to a method of manufacturing a land grid array (LGA) on a surface of a system on module (SOM). The method may include forming one or more center anchor pads on the surface of the SOM, forming one or more corner anchor pads on the surface of the SOM, forming a digital signal array on the surface of the SOM, forming one or more communications pads on the surface of the SOM, and forming one or more ground pads on the surface of the SOM. The present disclosure further relates to an SOM manufactured according to this method.

The present disclosure further relates to a method of manufacturing a main logic board (MLB). The method may include forming one or more MLB center anchor pads on a first surface of the MLB, forming one or more MLB corner anchor pads on the first surface of the MLB, forming one or more MLB digital signal pads on the first surface of the MLB, forming one or more MLB communications pads on the first surface of the MLB, and forming one or more MLB ground pads on the first surface of the MLB. The one or more MLB center anchor pads may be configured to be coupled to one or more land grid array (LGA) center anchor pads disposed on a second surface of a system on module (SOM). The one or more MLB corner anchor pads may be configured to be coupled to one or more LGA corner anchor pads disposed on the second surface of the SOM. The one or more MLB digital signal pads may be configured to be coupled to one or more LGA digital signal pads disposed on the second surface of the SOM. The one or more MLB communications pads may be configured to be coupled to one or more LGA communications pads disposed on the second surface of the SOM. The one or more MLB ground pads may be configured to be coupled to one or more LGA ground pads disposed on the second surface of the SOM. The present disclosure further relates to an MLB manufactured according to this method.

The present disclosure further relates to a method of manufacturing a mobile computing device comprising a main logic board (MLB) and a system on module (SOM). The method may include coupling one or more MLB center anchor pads disposed on a first surface of the MLB to one or more land grid array (LGA) center anchor pads disposed on a second surface of the SOM. The method may further include coupling one or more MLB corner anchor pads disposed on the first surface of the MLB to one or more LGA corner anchor pads disposed on the second surface of the SOM. The method may further include coupling one or more MLB digital signal pads disposed on the first surface of the MLB to one or more LGA digital signal pads disposed on the second surface of the SOM. The method may further include coupling one or more MLB communications pads disposed on the first surface of the MLB to one or more LGA communications pads disposed on the second surface of the SOM. The method may further include coupling one or more MLB ground pads disposed on the first surface of the MLB to one or more LGA ground pads disposed on the second surface of the SOM. The present disclosure further relates to a mobile computing device manufactured according to this method.

The above summary is provided merely for purposes of summarizing some example embodiments illustrating some aspects of the present disclosure. Accordingly, it will be appreciated that the above-described embodiments are merely examples and should not be construed to narrow the scope of the disclosure in any way. It will be appreciated that the scope of the disclosure encompasses many potential embodiments in addition to those herein summarized, some of which will be further described below.

BRIEF DESCRIPTION OF THE DRAWINGS

The accompanying drawings illustrate embodiments of the disclosure, and, together with the specification, including the general description above and the detailed description which follows, serve to explain the features of the present disclosure.

FIG. 10 illustrates an example method of manufacturing an MLB according to an example embodiment.

DETAILED DESCRIPTION

Figure 1:
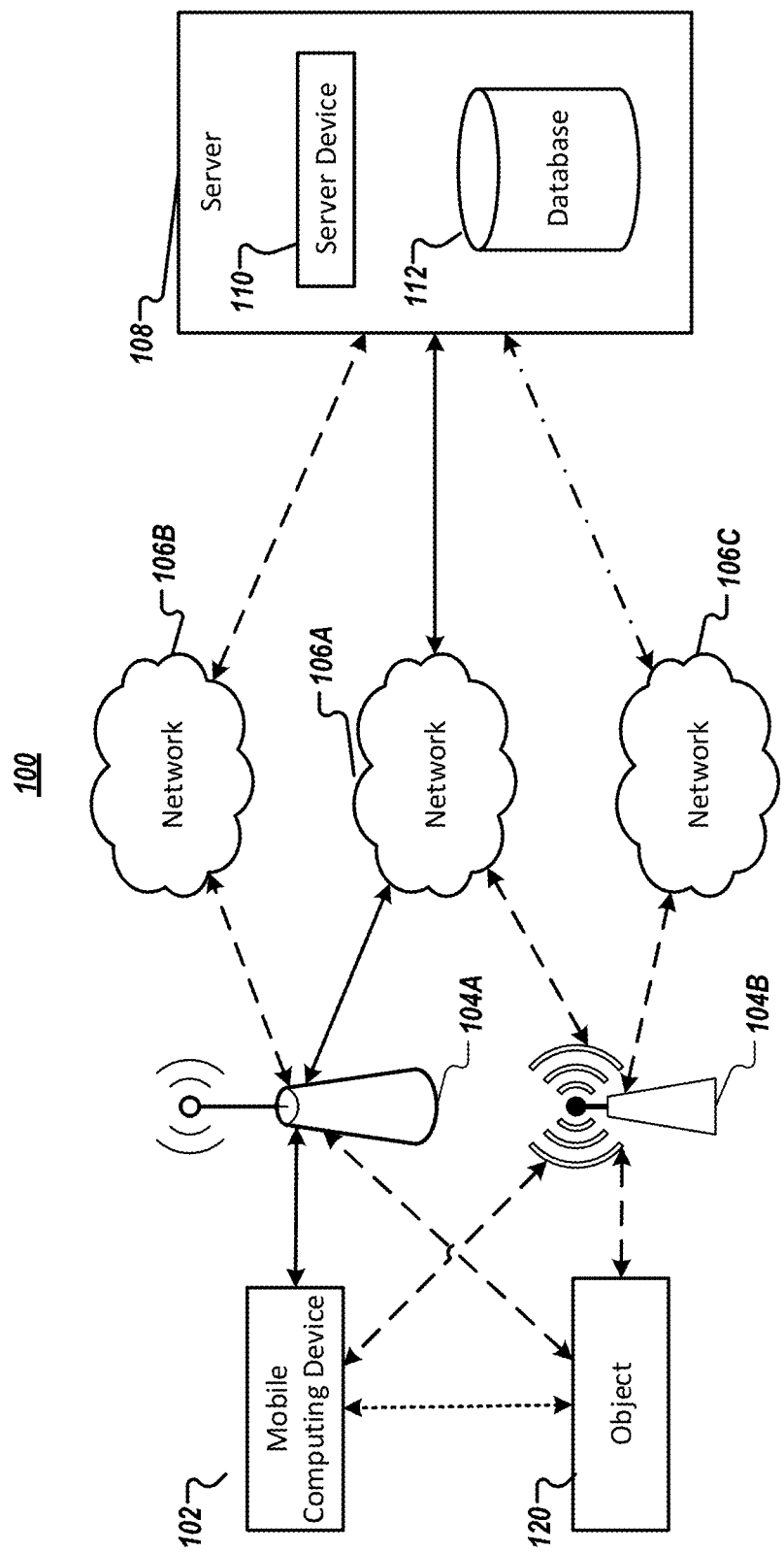
FIG. 1 illustrates a system diagram of an example implementation of some example embodiments described herein.

The present disclosure now will be described more fully with reference to the accompanying drawings in which some but not all embodiments of the disclosure are shown. Indeed, these embodiments may be embodied in many different forms and should not be construed as limited to the embodiments set forth herein; rather, these embodiments are provided so that this disclosure will satisfy applicable legal requirements. Like numbers refer to like elements throughout.

The components illustrated in the figures represent components that may be present in various embodiments of the disclosure described herein. In some instances, the components illustrated in the figures represent components that may not be present in various embodiments of the disclosure described herein. Accordingly, some embodiments of the present disclosure may include fewer components, more components, or different combinations of components than those shown in the figures while not departing from the scope of the disclosure.

As used herein, terms such as "front," "rear," "top," "bottom," "outside," "inside," "near," "along" and other similar terms are used for explanatory purposes in the examples provided below to describe the relative position of certain devices or portions of devices. Terminology used in this disclosure is not meant to be limiting insofar as devices described herein, or portions thereof, may be attached or utilized in other orientations.

The term "comprising" means including but not limited to, and should be interpreted in the manner it is typically used in the patent context. Use of broader terms such as comprises, includes, and having should be understood to provide support for narrower terms such as consisting of, consisting essentially of, and comprised substantially of.

The phrases "in one embodiment," "according to one embodiment," and the like generally mean that the particular feature, structure, or characteristic following the phrase may be included in at least one embodiment of the present disclosure or more than one embodiment of the present disclosure. Such phrases do not necessarily refer to the same embodiment.

The word "example" is used herein to mean "serving as an example, instance, or illustration." Any implementation described herein as "example" is not necessarily to be construed as preferred or advantageous over other implementations.

The terms "about" or "approximately" or the like, when used with a number, may mean that specific number or a range in proximity to that specific number, as understood by persons of skill in the art field.

If the specification states a component or feature "may," "can," "could," "should," "would," "preferably," "possibly," "typically," "optionally," "for example," "often," or "might" (or other such language) be included or have a characteristic, that particular component or feature is not required to be included or to have the characteristic. Such component or feature may be optionally included in some embodiments, or it may be excluded.

Definitions

As used herein, the term "transmitter" refers to any component that can generate radio waves for communication purposes while a "receiver" is used to generally refer to any component that can receive radio waves and convert the information into useable form. A "transceiver" generally refers to a component that can both generate radio waves and receive radio waves and is thus contemplated when either a transmitter or a receiver is discussed.

The terms "processor" and "processing circuitry" are used herein to refer to any programmable microprocessor, microcomputer or multiple processor chip or chips that can be configured by software instructions (applications) to perform a variety of functions, including the functions of the various embodiments described above. In some devices, multiple processors may be provided, such as one processor dedicated to central processing unit (CPU) functions, one processor dedicated to graphics processing unit (GPU) functions (including, but not limited to, images, video, gaming, augmented reality, and virtual reality), one processor dedicated to location functions (e.g., global positioning system (GPS) functions, relative location functions, etc.), one processor dedicated to camera functions (including, but not limited to, computer vision), one processor dedicated to scanning functions, one processor dedicated to digital signal processing (DSP) functions, one processor dedicated to display functions, one processor dedicated to security functions (e.g., encryption, decryption, authentication, fingerprint identification, facial recognition, etc.), one processor dedicated to power management functions (e.g., charging, battery, etc.), one processor dedicated to multimedia functions, one processor dedicated to other sensor functions, one processor dedicated to wireless communications functions, one processor dedicated to near-field communications (NFC) functions, one processor dedicated to executing software applications or executable instructions, or any suitable combination thereof. Software applications may be stored in the internal memory before they are accessed and loaded into the processors. The processors may include internal memory sufficient to store the software applications or executable instructions. In many devices the internal memory may be a volatile or nonvolatile memory, such as flash memory, or a mixture of both. In some instances, the memory may be located internal to another computing resource (e.g., to enable computer readable instructions to be downloaded over the Internet or another wired or wireless connection).

For the purposes of this description, a general reference to "memory" refers to memory accessible by the processors including internal memory or removable memory plugged into the device and memory within the processors themselves. For instance, memory may be any non-transitory computer readable medium configured to store computer readable instructions (e.g., computer program instructions, software applications) that are executable by a processor. Memory may include read-only memory (ROM), random access memory (RAM), removable media (e.g., an external hard drive, a flash memory stick, a secure digital (SD) card, a micro-SD card, a mini-SD card, etc.), or any other suitable electronic storage medium.

The term "computing device" is used herein to refer to any one or all of mobile computers, hand-held computers, programmable logic controllers (PLCs), programmable automation controllers (PACs), industrial computers, printers, barcode scanners, barcode imaging devices, desktop computers, personal data assistants (PDAs), laptop computers, tablet computers, smart books, palm-top computers, personal computers, smartphones, headsets, smartwatches, and similar electronic devices equipped with at least a processor configured to perform the various operations described herein. Portable electronics devices such as mobile computers, handheld computers, laptop computers, tablet computers, printers, barcode scanners, barcode imaging devices, smartphones, headsets, and smartwatches are generally collectively referred to as "mobile computing devices."

The term "server" is used to refer to any computing device capable of functioning as a server, such as a master exchange server, web server, mail server, document server, or any other type of server. A server may be a dedicated computing device or a computing device including a server module (e.g., running an application which may cause the computing device to operate as a server). A server module (e.g., server application) may be a full function server module, or a light or secondary server module (e.g., light or secondary server application) that is configured to provide synchronization services among the dynamic databases on computing devices. A light server or secondary server may be a slimmed-down version of server type functionality that can be implemented on a computing device, such as a smart phone, thereby enabling it to function as an Internet server (e.g., an enterprise e-mail server) only to the extent necessary to provide the functionality described herein.

Overview

Modular electronics platforms (e.g., electronic modules) included in mobile computing devices such as portable wireless devices are susceptible to many risks. In particular, large electronic modules (e.g., electronic modules with footprints greater than about 30 millimeters by about 30 millimeters) may be susceptible to increased risks. To reduce these risks, the connection between the module and the main electronics of the mobile computing device must be small, thin, or both. The connection must be rugged and able to withstand drop, shock, and vibration with no more than a suitable amount of degradation in device performance. The connection must conduct heat generated by the module to the main electronics. The connection must provide a low impedance radio frequency (RF) connection. The connection must be low in cost.

However, typical connection technologies do not adequately mitigate these risks or address these considerations. For example, large modules that attempt to mitigate these risks are not suitable for use in portable devices. Conversely, modules used in portable devices are limited in size (e.g., these modules have footprints less than 30 millimeters by 30 millimeters), which, as a result, could limit their functionalities. Further, connection technologies that can handle high pin count do not provide an RF connection and are high in cost.

This disclosure describes various connection and modularization methods, systems, and apparatuses that solve these problems for modular electronic platform installed in mobile computing devices. More specifically, the present disclosure describes connection and modularization methods, systems, and apparatuses based on various land grid array (LGA) patterns for modular electronics platforms. The disclosed LGA patterns provide connections between a large module (e.g., a module with a footprint greater than about 30 millimeters by about 30 millimeters, such as a system on module (SOM)) and the main electronics (such as a main logic board (MLB)) of a mobile computing device. The disclosed LGA patterns further provide connections that are small, thin, or both. The disclosed LGA patterns further provide connections that are rugged and able to withstand drop, shock, and vibration with no more than a suitable amount of degradation in device performance. For example, the disclosed LGA patterns may prevent digital signal connections from becoming disconnected when a mobile computing device is dropped on a concrete floor from a height of eight feet. The disclosed LGA patterns further provide connections that conduct heat generated by the module to the main electronics. The disclosed LGA patterns further provide connections that provide low impedance radio frequency (RF) connections. The disclosed LGA patterns further provide connections that are low in cost. The present disclosure may be particularly beneficial when modular electronics, rapid product development, low cost of certification, or any combination thereof are desired.

In some embodiments, the present disclosure provides an LGA pattern comprising of anchor pads, RF pads, a digital array, and perimeter ground pads. For example, the LGA pattern may comprise five anchor pads consisting of a center anchor pad and four corner anchor pads. The anchor pads provide strength to the main board connection. The RF pads maintain a characteristic impedance across the connection to the main logic board. The digital array provides over 400 connections between the module and the main logic board. The center anchor pad may be larger than each of the corner anchor pads and provide good thermal conduction to the main logic board. For example, the center anchor pad may have a footprint of about fifteen millimeters by about fifteen millimeters, while each of the corner anchor pads may have a footprint of about five millimeters by about six millimeters.

Example System Architecture for Implementing Embodiments of the Present Invention FIG. 1 illustrates a system diagram of an example implementation of some example embodiments described herein. The system 100 may include a mobile computing device 102. The mobile computing device 102 may be implemented as a mobile computing device, such as a mobile computer, hand-held computer, laptop computer, smartphone, cellular phone, tablet computer, barcode scanner, barcode imaging device, printer, portable wireless device, networked device, watch, wearable device, consumer electronics device, or other device, that may be used for any suitable purpose. The system 100 may further include an object 120. For example, object 120 may be a container having an object identifier such as a serial number, a one-dimensional barcode, a two-dimensional barcode, a three-dimensional barcode, or a matrix barcode. In another example, object 120 may be a two-dimensional or three-dimensional augmented reality object or image. In another example, object 120 may be a two-dimensional or three-dimensional virtual reality object or image. In another example, object 120 may be another mobile device.

In some embodiments, mobile computing device 102 may be capable of interacting with object 120. Mobile computing device 102 may be configured to interact with object 120 by imaging, scanning, tracking, or communicating with object 120. For example, mobile computing device 102 may be configured to interact with object 120 by scanning object 120 using a barcode imaging device to scan a barcode disposed on a surface of object 120. In another example, mobile computing device 102 may be configured to interact with object 120 by tracking object 120 using a camera. In another example, mobile computing device 102 may be configured to interact with object 120 by directly or indirectly communicating with object 120 using wireless communications circuitry or near-field communications circuitry.

Further, the mobile computing device 102 may be connected to a cell tower 104A, a network access point 104B, or both. The object 120 may also be connected to the cell tower 104A, the network access point 104B, or both. The cell tower 104A may be further connected to a remote server 108 through a network 106B. The object 120 may be connected to the remote server 108 through a network 106C. In some embodiments, both the mobile computing device 102 and the object 120 may be connected to the remote server 108 through a same network 106A.

Networks 106A, 106B, and 106C may include any wired or wireless communication network including, for example, a wired or wireless local area network (LAN), personal area network (PAN), metropolitan area network (MAN), wide area network (WAN), or the like, as well as any hardware, software and/or firmware required to implement it (such as, e.g., network routers, etc.). For example, networks 106A, 106B, and 106C may include an 802.11, 802.16, 802.20, and/or WiMax network. Further, networks 106A, 106B, and 106C may include a public network, such as the Internet, a private network, such as an intranet, or combinations thereof, and may utilize a variety of networking protocols including, but not limited to, TCP/IP based networking protocols. In some embodiments, the protocol is a custom protocol of JSON objects sent via a Websocket channel. In some embodiments, the protocol is JSON over RPC, JSON over REST/HTTP, and the like.

The remote server 108 may include a server device such as server device 110, a local database such as database 112, or both. In some embodiments, remote server 108 may include object identification data (e.g., object name, identification number, lot number, manufacturing date, shipment date, inventory control number, ownership data, one or more physical addresses, one or more internet protocol (IP) addresses, one or more media access control (MAC) addresses, etc.) stored in association with an object identifier (e.g., a serial number, a one-dimensional barcode, a two-dimensional barcode, a three-dimensional barcode, or a matrix barcode, etc.). For example, database 112 of remote server 108 may include object identification data stored in association with an object identifier disposed on a surface on object 120. In some embodiments, remote server 108 or one or more portions thereof may be provided by one or more cloud-based servers.

Example Apparatus for Implementing Embodiments of the Present Invention

As should be appreciated, various embodiments of the present invention may be implemented as methods, apparatus, systems, computing devices, computing entities, and/or the like. For example, embodiments of the present invention may take the form of an apparatus, a system, or the like. Thus, embodiments of the present invention may take the form of an entirely hardware embodiment.

1. Mobile Computing Device

In some embodiments, one or more components of the mobile computing device 102 of FIG. 1 may be provided as a mobile computing device, a mobile computer, a portable wireless device, a printer, an appliance, an industrial or manufacturing device, or any other suitable device, apparatus or system. For example, the mobile computing device 102 may comprise one or more chipsets (e.g., one or more chipsets 206 shown in FIGS. 2A-2B), a system on module (SOM) (e.g., SOM 204 shown in FIGS. 2A-2B), a main logic board (MLB) (e.g., MLB 202 shown in FIGS. 2A-2B).

Figure 2A:
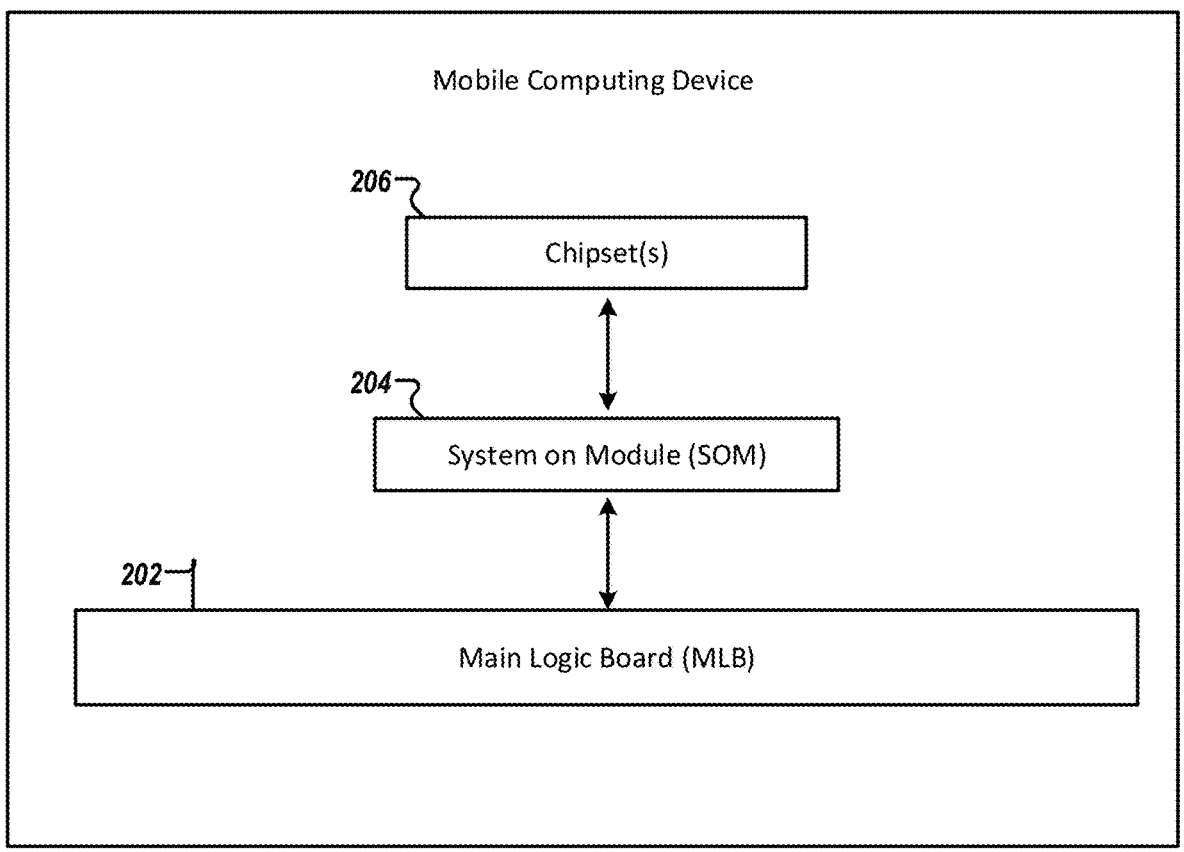
FIGS. 2A and 2B illustrate an example mobile computing device according to example embodiments.
Figure 2B:
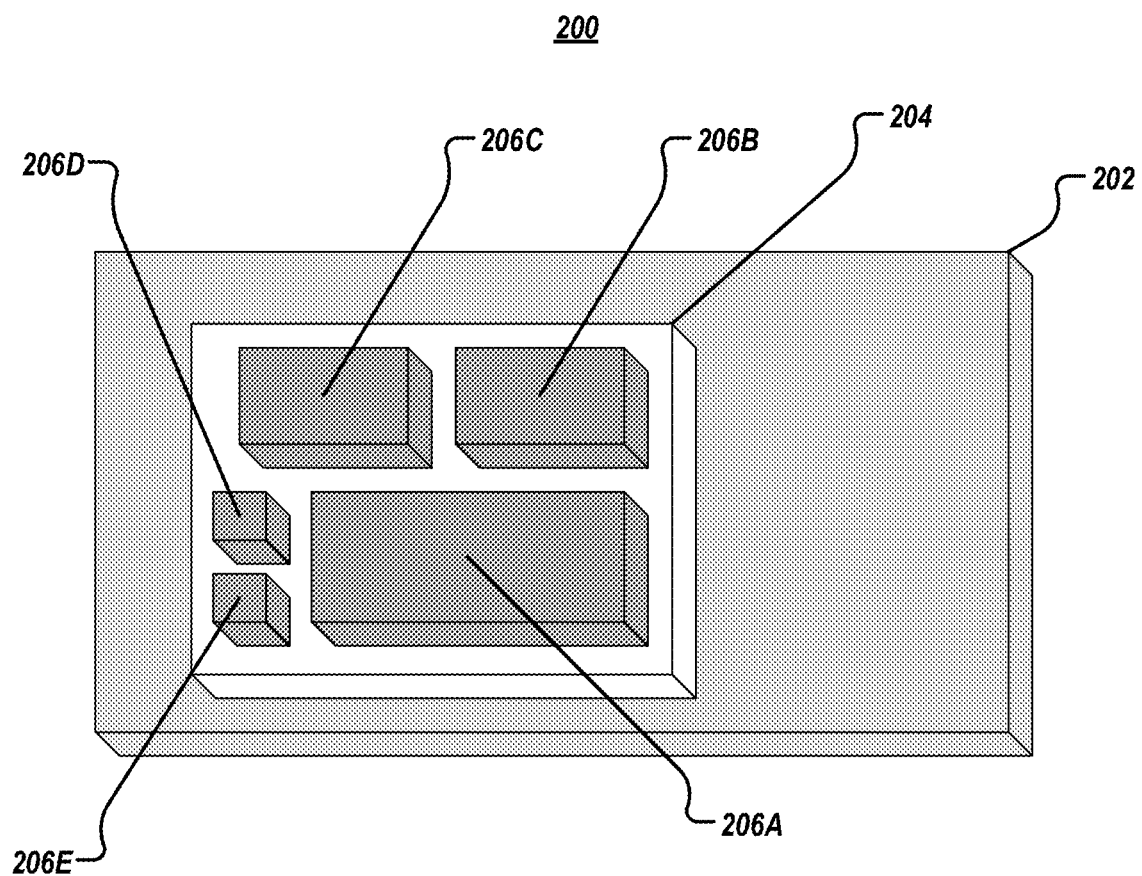

FIGS. 2A and 2B illustrate an example mobile computing device 200 according to example embodiments. FIG. 2A illustrates a schematic block diagram of an example mobile computing device 200 according to an example embodiment.

Referring now to FIG. 2A, in accordance with some example embodiments, the mobile computing device 200 may include various components, such as a main logic board (MLB) 202, a system on module (SOM) 204, and one or more chipsets 206. The MLB 202 may be, for example, a main logic board, a main electronics board, a motherboard, a circuit board, a printed circuit board, a breadboard, or any other suitable device.

The SOM 204 may be, for example, a board-level circuit configured to integrate a system function in a single module. For example, the SOM 204 may be configured to integrate the various functions of the one or more chipsets 206 in a single module. Details of the SOM are described further herein.

The one or more chipsets 206 may comprise, for example, processing circuitry (e.g., processing circuitry 302 shown in FIG. 3 as described further below), memory (e.g., memory 304 shown in FIG. 3 as described further below), power and battery management circuitry (e.g., power management circuitry 310 shown in FIG. 3 as described further below), audio circuitry (e.g., input-output circuitry 308 shown in FIG. 3 as described further below), wireless communications circuitry (e.g., communications circuitry 306 shown in FIG. 3 as described further below), and near field communications circuitry (e.g., communications circuitry 306 shown in FIG. 3 as described further below).

In some embodiments, the SOM 204 may comprise a first surface configured to be coupled mechanically, electrically, or both to the one or more chipsets 206. For example, the SOM 204 may comprise a first surface configured to be coupled mechanically and electrically to the one or more chipsets 206 using solder paste.

In some embodiments, the SOM 204 may comprise a second surface opposite the first surface configured to be coupled mechanically, electrically, or both to the MLB 202. For example, the SOM 204 may comprise a second surface configured to be coupled mechanically and electrically to the MLB 202 using a land grid array (LGA) and solder paste. In some embodiments, the mobile computing device 200 may comprise a printed circuit board assembly (PCBA) comprising the composite MLB 202 and SOM 204.

FIG. 2B illustrates a perspective view of the example mobile computing device 200 according to an example embodiment. In accordance with some example embodiments, mobile computing device 200 may include various components, such as MLB 202, SOM 204, and chipsets 206A, 206B, 206C, 206D, and 206E.

2. Chipsets

Figure 3:
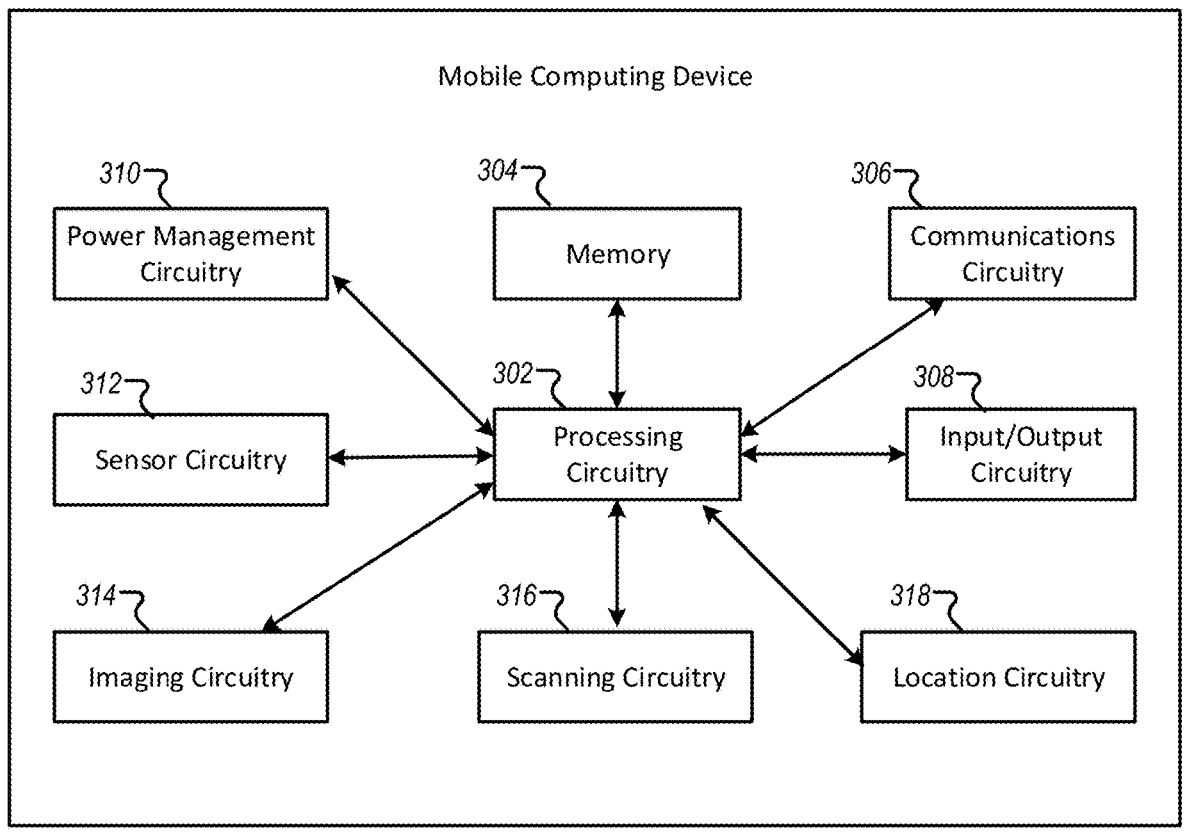
FIG. 3 illustrates a schematic block diagram of an example mobile computing device according to an example embodiment.

FIG. 3 illustrates a schematic block diagram of an example mobile computing device 300 according to an example embodiment. In accordance with some example embodiments, mobile computing device 300 may include various components, such as processing circuitry 302, memory 304, communications circuitry 306, input-output circuitry 308, power management circuitry 310, sensor circuitry 312, imaging circuitry 314, scanning circuitry 316, location circuitry 318, any other suitable circuitry, or any combination thereof.

As referred to herein, "circuitry" includes hardware, software and/or firmware configured to perform one or more particular functions. In this regard, a circuitry of mobile computing device 300 as described herein may be embodied as, for example, chipset, circuitry, hardware elements (e.g., a suitably programmed processor, combinational logic circuit, circuit board, logic board, module, and/or the like), a computer program product comprising computer-readable program instructions stored on a non-transitory computer-readable medium (e.g., memory 304) that is executable by a suitably configured processing device (e.g., processing circuitry 302), or some combination thereof.

Processing circuitry 302 may, for example, be embodied as various means including processing circuitry, one or more microprocessors with accompanying digital signal processor(s), one or more processors without an accompanying digital signal processor, one or more coprocessors, one or more multi-core processors, one or more controllers, one or more computers, various other processing elements (e.g., one or more integrated circuits (ICs), one or more application specific integrated circuits (ASICs), one or more programmable logic devices (PLDs), one or more field programmable gate arrays (FPGAs), etc.), or any combination thereof. Accordingly, in some embodiments processing circuitry 302 may comprise a plurality of processors or processing circuitry. The plurality of processors may be embodied on a single computing device or may be distributed across a plurality of computing devices collectively configured to function as mobile computing device 300. The plurality of processors may be in operative communication with each other and may be collectively configured to perform one or more functionalities of mobile computing device 300 as described herein. In an example embodiment, processing circuitry 302 is configured to execute instructions stored in memory 304 or otherwise accessible to processing circuitry 302. These instructions, when executed by processing circuitry 302, may cause mobile computing device 300 to perform one or more of the functionalities of mobile computing device 300 as described herein.

Whether configured by hardware, firmware, software methods, or a combination thereof, processing circuitry 302 may comprise circuitry capable of performing operations according to embodiments of the present disclosure while configured accordingly. For example, when processing circuitry 302 is embodied as an ASIC, PLD, or FPGA, processing circuitry 302 may comprise specifically configured hardware for conducting one or more operations described herein.

Memory 304 may comprise, for example, volatile memory, non-volatile memory, or both. Although illustrated in FIG. 3 as a single memory, memory 304 may comprise a plurality of memory components. The plurality of memory components may be embodied on a single computing device or distributed across a plurality of computing devices. In various embodiments, memory 304 may comprise, for example, a hard disk, random access memory, cache memory, random access memory (RAM), read only memory (ROM), erasable programmable read-only memory (EPROM), electrically erasable programmable read-only memory (EEPROM), flash memory, a solid state drive, magnetic cassettes, magnetic tape, magnetic disk storage or other magnetic storage devices, a compact disc read only memory (CD-ROM), digital versatile disc read only memory (DVD-ROM), an optical disc, circuitry configured to store information, or some combination thereof. Memory 304 may be configured to store information, data (including, but not limited to, item data, profile data, object identification data, object identifiers, etc.), applications, instructions, or the like for enabling mobile computing device 300 to carry out various functions in accordance with example embodiments of the present disclosure. For example, in at least some embodiments, memory 304 is configured to buffer input data for processing by processing circuitry 302. Additionally or alternatively, in at least some embodiments, memory 304 is configured to store program instructions for execution by processing circuitry 302. Memory 304 may store information in the form of static and/or dynamic information. This stored information may be stored and/or used by mobile computing device 300 during the course of performing its functionalities.

Communications circuitry 306 may be embodied as any device or means embodied in circuitry, hardware, a computer program product comprising computer readable program instructions stored on a computer readable medium (e.g., memory 304) and executed by a processing device (e.g., processing circuitry 302), or a combination thereof that is configured to receive and/or transmit data from/to another device and/or network, such as, for example, a mobile device or a remote server. In some embodiments, communications circuitry 306 (like other components discussed herein) may be at least partially embodied as or otherwise controlled by processing circuitry 302. In this regard, communications circuitry 306 may be in communication with processing circuitry 302, such as via a bus. Communications circuitry 306 may include, for example, a USB connector, a micro USB connector, an antenna, a transmitter, a receiver, a transceiver, network interface card and/or supporting hardware and/or firmware/software for enabling communications with another computing device.

Communications circuitry 306 may further include, for example, wireless communications circuitry. Wireless communications circuitry may include, for example, a Bluetooth antenna or transceiver, a wireless wide area network (WAN) antenna or transceiver (including, but not limited to, one or more integrated radios capable of switching between UMTS and CDMA radio networks), a wireless local area network (LAN) antenna or transceiver (including, but not limited to, one or more integrated radios capable of switching between IEEE 802.11 alb/gin networks), a wireless personal area network (PAN) antenna or transceiver (including, but not limited to, one or more integrated radios capable of communicating via Bluetooth power class 1.5, version 4), a Wi-Fi antenna or transceiver, a near-field communication (NFC) antenna or transceiver, a radio frequency (RF) antenna or transceiver, a radio-frequency identification (RFID) antenna or transceiver, a cellular antenna or transceiver, any other suitable wireless communications circuitry, or any combination thereof. Communications circuitry 306 may further include triangulation circuitry, signal strength detectors, and any other circuitry configured to generate data for use in determining geographic or relative location.

Communications circuitry 306 may be configured to receive and/or transmit any data that may be stored by memory 304 using any protocol that may be used for communications between computing devices. Communications circuitry 306 may additionally or alternatively be in communication with the memory 304, input-output circuitry 308 and/or any other component of mobile computing device 300, such as via a bus. Further, the communications circuitry 306 may transmit electronic signals to, and receive electronic signals from, a connected device such as object 120 and remote server 108, as shown in FIG. 1. In some embodiments, communications circuitry 306 may be configured directly or indirectly communicate with an object, such as object 120, using wireless communications circuitry or near-field communications circuitry.

Input-output circuitry 308 may be in communication with processing circuitry 302 to receive an indication of a user input. Additionally, input-output circuitry 308 may be in communication with processing circuitry 302 to provide an audible, visual, mechanical, or other output to a user. For example, input-output circuitry 308 may include support for a keyboard, a keypad (e.g., a numeric keypad, an alphanumeric keypad, a QWERTY keypad, etc.), a mouse, a trackball, a joystick, a display, a touch screen display, a touch panel, one or more buttons, a microphone, a speaker, an RFID reader, barcode reader, biometric scanner, one or more light emitting diodes (LEDs), and/or other input/output mechanisms. In some embodiments, the input-output circuitry 308 may include a microphone for receiving voice commands from a user. In some embodiments, the input-output circuitry 308 and the processing circuitry 302 may process received audio signals to determine voice commands. Further, the input-output circuitry 308 may include haptic sensors, gesture sensors, motion sensors, sound sensors, a combination of touch and voice command circuitry, any other suitable sensors or circuitry, or any combination thereof. In some embodiments (like other components discussed herein), input-output circuitry 308 may even be eliminated from mobile computing device 300.

Input-output circuitry 308 may be in communication with the memory 304, communications circuitry 306, and/or any other component of mobile computing device 300, such as via a bus. One or more than one input-output circuitry and/or other component can be included in or coupled to mobile computing device 300. In some embodiments, the input-output circuitry 308 may receive a command from a user to control a function of the mobile computing device. For example, a user may provide an input through a touch screen display of the mobile computing device 300. The input-output circuitry 308 may provide an indication of the received command to the processing circuitry 302.

Power management circuitry 310 may be embodied as any device or means embodied in circuitry, hardware, a computer program product comprising computer readable program instructions stored on a computer readable medium (e.g., memory 304) and executed by a processing device (e.g., processing circuitry 302), or a combination thereof that is configured to receive energy from, or transmit energy to, another component of mobile computing device 300, such as a battery. In some embodiments, power management circuitry 310 (like other components discussed herein) can be at least partially embodied as or otherwise controlled by processing circuitry 302. In this regard, power management circuitry 310 may be in communication with processing circuitry 302, such as via a bus.

In some embodiments, power management circuitry 310 may include a USB connector and an electrical plug. In some embodiments, power management circuitry 310 may include a wireless charger to wirelessly charge mobile computing device 300. Power management circuitry 310 may include, for example, a USB connector, a micro USB connector, an electrical plug, a 120 VAC plug, a 240 VAC plug, a wireless charger, an inductive charger, a Qi inductive charger, and/or supporting hardware and/or firmware/software for enabling wired or wireless charging to another device. The USB connector may be, for example, a USB 2.0 connector, a USB 3.0 connector, a USB 3.1 connector, a USB-C connector, a micro-USE connector, a mini-USB connector, or any other USB connector. In some embodiments, the mobile computing device 300 may include a charger for providing power to a coupled mobile device. In this instance, the power management circuitry 310 may include all required charging components, such as, but not limited to, resistors, voltage regulators, rectifier diode, and the like. In some embodiments, the power management circuitry 310 may provide voltage stabilization and/or regulation to convert the supplied voltage to an appropriate voltage level suitable to the mobile computing device 300 or any of its various components. In an embodiment, the power management circuitry 310 and a separate charging device may both be capable of providing charge to the mobile device, separately and/or simultaneously. Power management circuitry 310 may be configured to receive and/or transmit any data that may be stored by memory 304 using any protocol that may be used for communications between computing devices. Power management circuitry 310 may additionally or alternatively be in communication with the memory 304, input-output circuitry 308 and/or any other component of mobile computing device 300, such as via a bus.

Sensor circuitry 312 may be embodied as any device or means embodied in circuitry, hardware, a computer program product comprising computer readable program instructions stored on a computer readable medium (e.g., memory 304) and executed by a processing device (e.g., processing circuitry 302). In some embodiments, sensor circuitry 312 may include one or more sensors, such as an ambient light sensor, a proximity sensor, an accelerometer, a gyroscope, a magnetometer, a pressure sensor, an altimeter, a barometric pressure sensor, a temperature sensor, a photodetector, a motion sensor, any other suitable sensor, or any combination thereof. Sensor circuitry 312 may be configured to receive and/or transmit any data that may be stored by memory 304 using any protocol that may be used for communications between computing devices. Sensor circuitry 312 may additionally or alternatively be in communication with the memory 304, input-output circuitry 308 and/or any other component of mobile computing device 300, such as via a bus.

Imaging circuitry 314 may be embodied as any device or means embodied in circuitry, hardware, a computer program product comprising computer readable program instructions stored on a computer readable medium (e.g., memory 304) and executed by a processing device (e.g., processing circuitry 302). In some embodiments, imaging circuitry 314 may include a digital camera, a charge-coupled device (CCD) image sensor, a complementary metal-oxide semiconductor (CMOS) image sensor, a photodetector, one or more optical components (e.g., one or more lenses, filters, mirrors, beam splitters, polarizers, etc.), autofocus circuitry, motion tracking circuitry, computer vision circuitry, image processing circuitry (e.g., one or more digital signal processors configured to process images for improved image quality, decreased image size, increased image transmission bit rate, etc.), any other suitable imaging circuitry, or any combination thereof. In some embodiments, imaging circuitry 314 may be configured image and track an object, such as object 120, using a camera. Imaging circuitry 314 may be configured to receive and/or transmit any data that may be stored by memory 304 using any protocol that may be used for communications between computing devices. Imaging circuitry 314 may additionally or alternatively be in communication with the memory 304, input-output circuitry 308 and/or any other component of mobile computing device 300, such as via a bus.

Scanning circuitry 316 may be embodied as any device or means embodied in circuitry, hardware, a computer program product comprising computer readable program instructions stored on a computer readable medium (e.g., memory 304) and executed by a processing device (e.g., processing circuitry 302). In some embodiments, scanning circuitry 316 may include barcode scanning circuitry, barcode reading circuitry, barcode imaging circuitry, an imaging engine (including, but not limited to, an ultra-slim area-imaging engine), motion tracking circuitry, computer vision circuitry, one or more LEDs, a digital camera, a CCD image sensor, a CMOS image sensor, a photodetector, one or more optical components (e.g., one or more lenses, filters, mirrors, beam splitters, polarizers, etc.), autofocus circuitry, image processing circuitry (e.g., one or more digital signal processors configured to process images for improved image quality, decreased image size, increased image transmission bit rate, etc.), decoding circuitry, any other suitable scanning circuitry, or any combination thereof. In some embodiments, scanning circuitry 316 may be configured to scan and decode a serial number, a one-dimensional barcode, a two-dimensional barcode, a three-dimensional barcode, or a matrix barcode disposed on a surface of an object, such as object 120 shown in FIG. 1. Scanning circuitry 316 may be configured to receive and/or transmit any data that may be stored by memory 304 using any protocol that may be used for communications between computing devices. Scanning circuitry 316 may additionally or alternatively be in communication with the memory 304, input-output circuitry 308 and/or any other component of mobile computing device 300, such as via a bus.

Location circuitry 318 may be embodied as any device or means embodied in circuitry, hardware, a computer program product comprising computer readable program instructions stored on a computer readable medium (e.g., memory 304) and executed by a processing device (e.g., processing circuitry 302). In some embodiments, location circuitry 318 may include global positioning system (GPS) circuitry, an altimeter, a barometric pressure sensor, relative positioning circuitry, photogrammetry circuitry, computer vision circuitry, one or more components described with reference to communications circuitry 306 (e.g., triangulation circuitry, signal strength detectors), sensor circuitry 312, imaging circuitry 314, scanning circuitry 316, any other suitable circuitry, or any combination thereof. In some embodiments, location circuitry 318 may be configured to determine the geographic location of an object, such as object 120 shown in FIG. 1, using GPS circuitry. In some embodiments, location circuitry 318 may be configured to determine the relative location of an object, such as object 120 shown in FIG. 1, with reference to another object or mobile computing device 102, using computer vision circuitry. Location circuitry 318 may be configured to receive and/or transmit any data that may be stored by memory 304 using any protocol that may be used for communications between computing devices. Scanning circuitry 316 may additionally or alternatively be in communication with the memory 304, input-output circuitry 308 and/or any other component of mobile computing device 300, such as via a bus.

3. System On Module (SOM)

A system on module (SOM) is a board-level circuit that integrates system functions into a single module. In some embodiments, the SOM may be a serviceable module that contains the core architecture of the mobile computing device, such as a microprocessor, memory, power and battery management, audio CODEC, Wi-Fi and/or Bluetooth radios (U.FL connector on top), NFC (RF signals through pin array). In some embodiments, the SOM may not contain sensors, WWAN (due to too many antenna connectors), and ESD protection.

Implementing one or more SOMs in a mobile computing device provides various technical benefits. For example, using SOM improves product longevity as processors can be upgraded without re-designing the entire product. It provides the flexibility to move away from commercial chipsets, the ability to update software when board support package (BSP) is no longer available, and the protection from end of life (EOL) of core components.

Implementing SOM also allows platform re-use. For example, one module could be used for multiple products such as handhelds, voice terminals, printers, among others. As such, it allows rapid development of derivative products (e.g., hardware, software, testing re-use) and manufacturing such products at higher volumes at lower cost. Further, using SOM lowers the cost for MLB, as it would require fewer layers.

Further, SOM provides improved serviceability (e.g., replacing MLB while preserving the SOM) and manufacturing flexibility (e.g., allowing just in time, final configuration).

In some example embodiments, the SOM may comprise pins, which allow the SOM to transmit/receive data to/from other components. For example, an SOM in a mobile computing device may comprise a minimum of 240 pads or pins, with a maximum flexibility of 316 pads or pins. For example, the SOM signals and pin count may of an example SOM include:

TABLE 1

Example SOM Signals and Pin Count

| Category | Signals | Pin Count |
|---|---|---|
| Sensors (21 pins total) | Accelerometer | 2 |
| | ALS/Proximity | 1 |
| | Compass | 2 |
| | Fingerprint | 2 |
| | Gyro | 1 |

TABLE 1-continued

Example SOM Signals and Pin Count

| Category | Signals | Pin Count |
|---|---|---|
| | Touch | 3 |
| | Keypad | 10 |
| Audio (30 pins total) | Headset | 4 |
| | Line out | 4 |
| | Microphone | 15 |
| | Speaker | 6 |
| | Hearing aid | 1 |
| Power (38 pins total) | Rails | 25 |
| | VDC IN | 6 |
| | Battery | 7 |
| Display (26 pins total) | Main display | 13 |
| | HDMI | 13 |
| Camera (42 pins total) | Rear camera | 13 |
| | Front camera | 13 |
| | Imager | 16 |
| Transports (34 pins total) | USB (3 ports) | 14 |
| | I²C (6 busses) | 12 |
| | SDIO | 6 |
| | UART | 2 |
| | LED | 14 |
| | Dock control | 6 |
| | Haptics | 2 |
| | NFC | 2 |
| | EEPROM | 1 |
| | Debug | 1 |
| | Ground | 4 |
| Reserved for Future Use (59 pins total) | Analog MUX | 2 |
| | MSM GPIOs | 28 |
| | Backlight | 2 |
| | PMIC GPIOs | 15 |
| | PMIC MPPs | 2 |
| | Undefined | 10 |

In some example embodiments, various connection technologies may be used for connecting the SOM to the MLB. For example, such connection technical may include leaf springs (for example, using beryllium copper), fuzz buttons (for example, using gold-plated molybdenum wire), a connector, and direct land grid array (LGA).

In some embodiments, leaf springs may be used. Leaf springs provide thinner, higher density, and lower cost than fuzz buttons. For example, leaf spring's characteristics and performance may include:

TABLE 2

Example Leaf Spring Characteristics And Performance

| Characteristics | Performance |
|---|---|
| Thickness | 0.28 mm minimum |
| Pitch | 0.74 mm minimum |
| Current | 0.75 A |
| Resistance | 30 milli-ohms |
| Compression force | 35 grams/position |
| Temperature range | −30 degrees Celsius to +85 degrees Celsius |
| Bandwidth | 25 GHz |
| Antenna Signals | NFC (possibly Wi-Fi/BT as well) |
| Vibration | 10-55 kHz (no discontinuity greater than 10 ns) |
| Drop | 50 G, 11 ms (no discontinuity greater than 10 ns) |

In some embodiments, fuzz buttons may be used. The fuzz buttons may provide more current, higher bandwidth, better vibe/drop specs than springs (such as leaf springs). For example, fuzz button's characteristics and performance may include:

TABLE 3

Example Fuzz Button Characteristics And Performance

| Characteristics | Performance |
| --- | --- |
| Thickness | 0.813 mm minimum |
| Pitch | 1 mm minimum |
| Current | 3 A |
| Resistance | 20 milli-ohms |
| Compression force | 25 grams/position |
| Temperature range | −20 degrees Celsius to +85 degrees Celsius |
| Bandwidth | 50 GHz |
| Vibration | 20 G, 10-2kHz (no discontinuity greater than 2 ns) |
| Drop | 100 G, 6 ms (no discontinuity greater than 2 ns) |

In some examples, a connector (such as one manufactured by Neoconix™) may be used. Such connector may comprise an interposer, mounting hardware, coax cable, U.FL connector, and PCB (10 layers). It may further comprise or enable, in some examples: 316 positions, single screw, and 1.0 mm thick interposer plus two 0.3 mm stiffeners. Using a connector provides benefit such as no gold needed on SOM, around ten percent lower cost interposer, and lower resistance. However, in some examples, the stackup is around 0.5 mm thicker, and no components is allowed under stiffener.

In some examples, the choice of a connector (such as those manufactured by Neoconix™) may be evaluated under two steps. Step one may comprise the following considerations: (1) whether standard interposer is available; (2) the form factor and hard wired battery; (3) daisy chain and two or more zones; (4) ability to count discontinuities (for example, six LEDs attached to counter and edge trigger); (5) tune RC for detection of discontinuity; (6) vibration, drop, and tumble; (7) contact resistance; and (8) signal bandwidth (MIPI, USB 3.0) and S parameters. Step two may comprise the following considerations: (1) re-create form factor using SOM; (2) custom interposer; and (3) run full suite of reliability, functionality, EMC, and performance.

In some examples, direct LGA (land grid array) may be used. The direct LGA may further enhance the technical benefits of using an SOM (e.g., product longevity, platform re-use, serviceability, manufacturing flexibility). Further, direct LGA may provide the thinnest solution at the lowest cost. The direct LGA supports antennas such as Wi-Fi antennas, BT antennas, NFC antennas, and WWAN antennas. In choosing direct LGA, some additional considerations may, in some examples, include: (1) how many SOMs are to be connected (e.g., processor options; RAM options; flash options; speed options; radio options); (2) will a SOM change needed on one product trigger re-certification of all products; (3) can local configuration still be done with LGA; and (4) how to qualify LGA technology (e.g., vibe, shock, drop, tumble, temperature, humidity; self-diagnostics, loop-back testing).

4. Land Grid Array (LGA)

A land grid array (LGA) is an electronics packaging technology used for connection to other components. As described further below, the LGA comprises metal pads (or "land") for external electrical connection instead of leads (as in the pin grid array) or solder balls (as in the ball grid array). In various embodiments, these metal pads are arranged in a grid or array form.

In some example embodiments, the present disclosure pertains to an LGA form factor for System on Module (SOM) utilizing a multi-function chipset including cellular, Wi-Fi, BT, NFC and WWAN capabilities. In some embodiments, one example form factor for this module is a mobile computing device, such as a mobile computer. Leveraging this SOM on derivative devices may reduce product time to market and reduce certification time and costs. For example, there may be not be a need (or a particular need) to type certify the SOM as an independent radio module transmitter.

As described above, embodiments of the present invention overcome various technical challenges. Such technical challenges may include, for example, a mismatch of product lifecycle and chipset availability (e.g., products can be sold for up to 7 years and in service for even longer, but typical chipset lifecycle is only around 3 years). In addition, while multiple form factors and/or markets may exist for certain devices that have similar architecture and feature sets (for example, screen devices, keypad (flashlight) devices, vehicle mounted units, plus others (such as wearables, printers). In this regard, slight variances in hardware severely increase costs for development, test, and verification. Further, there is a high cost of MLB replacement in service (e.g., scrapping MLBs), and, in some examples, late stage configuration for faster delivery to customer is needed.

Implementing a LGA with SOM in accordance with various embodiments of the present invention provides various technical benefits, including those described above in connection with SOM, such as product longevity (e.g., upgrade processor without re-designing the entire product; flexibility to move away from certain chipsets; ability to update software when BSP no longer available; protection from EOL of core components), platform re-use (e.g., one module for multiple products (e.g., handhelds, voice terminals, printers), rapid development of derivative products (e.g., hardware, software, testing re-use), higher volumes at lower cost (for example, because MLB has fewer layers); and serviceability (e.g., replace MLB while preserving the SOM).

Further, the LGA in accordance with various embodiments of the present invention provides technical improvements. In some embodiments, a large center ground pad and large corner pads are used. Digital signals are around the center pad, but pulled away from the edge, while RF signals are near the edge (which may increase the signal quality and strength of RF signals). As such, the LGA in accordance with various embodiments of the present invention (1) protects the signal pads from breaking contact when dropped, shocked, or vibrated, (2) conducts heat away from the module to the main board, and (3) allows for good signal integrity for the high frequency RF signals. Details of various embodiments are described further herein.

Figure 4A:
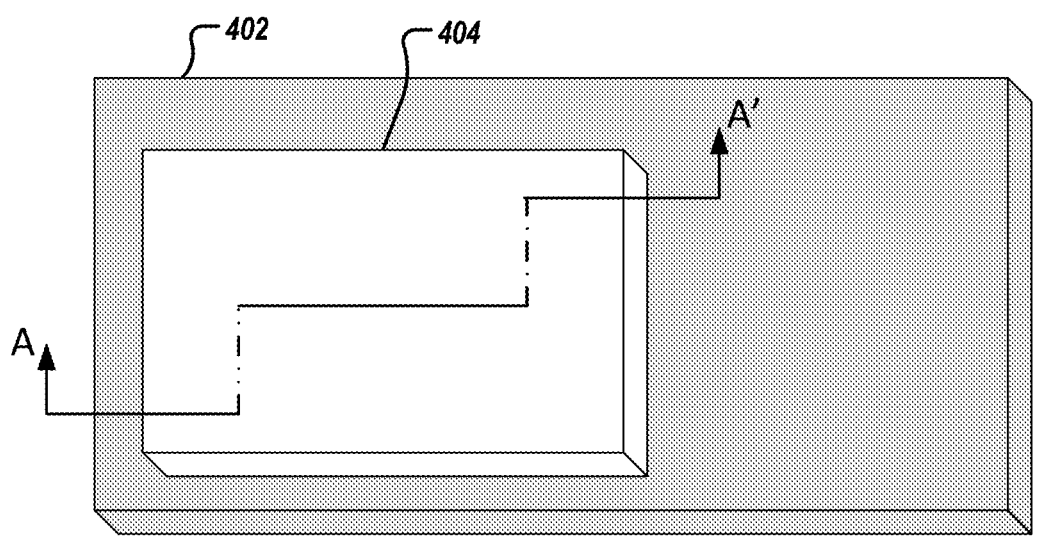
FIGS. 4A and 4B illustrate a cross-section of a portion of an example mobile computing device according to example embodiments.
Figure 4B:
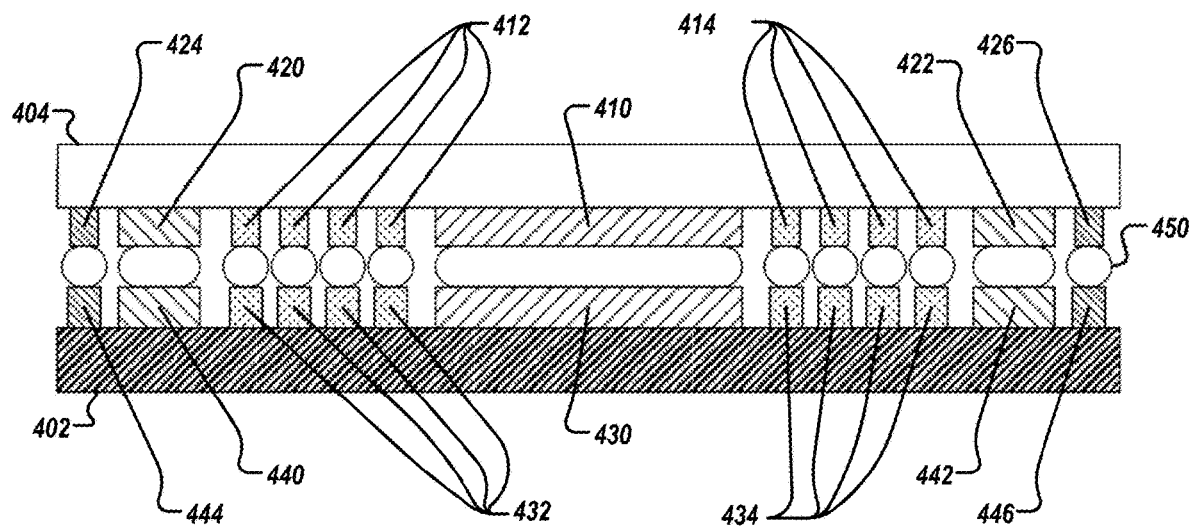

FIGS. 4A and 4B illustrate perspective and cross-sectional views of a portion of an example mobile computing device 400 according to example embodiments.

FIG. 4A illustrates a perspective view of an example mobile computing device 400 according to an example embodiment. In accordance with some example embodiments, the mobile computing device 400 may include various components, such as MLB 402 and SOM 404 as shown in FIG. 4A.

FIG. 4B illustrates a cross-section A-A' of the example mobile computing device 400 according to an example embodiment. As shown in FIG. 4B, mobile computing device 400 may include various connections between MLB 402 and SOM 404.

For example, the SOM 404 may comprise a surface (sometimes referred to herein as the "second surface" of SOM 404) configured to be coupled mechanically and/or electrically to the MLB 402 using a land grid array (LGA) and, in some embodiments, solder (e.g., solder layer 450 comprising one or more solder balls), underfill, or both. In some embodiments, solder may be may be formed on the surface of the MLB 402, SOM 404, and/or the LGA by printing solder paste thereon. In some embodiments, solder may be may be formed on the surface of the MLB 402, SOM 404, and/or the LGA by applying solder paste to the surface, applying heat to melt the solder paste, and removing redundant solder paste. The solder, solder paste, and/or solder layer 450 may comprise one or more electrically conductive elements, such as bismuth, tin, indium, silver, lead, and alloys or layers thereof. In some embodiments, solder layer 450 may be formed by placing the SOM 404 and the LGA on the MLB 402 and reflowing the solder using a rework device or machine. In some embodiments, underfill may then be applied by spreading or filling.

As shown in FIG. 4B, the LGA may include one or more LGA center anchor pads, such as LGA center anchor pad 410, disposed on the surface of the SOM 404. The LGA may further include one or more LGA corner anchor pads, such as LGA corner anchor pads 420 and 422, disposed on the surface of the SOM 404. The LGA may further include a digital signal array disposed on the surface of the SOM 404. For example, the LGA may comprise one or more LGA digital signal pads, such as LGA digital signal pads 412 and 414, disposed on the second surface of the SOM 404 between the one or more LGA center anchor pads and the one or more LGA corner anchor pads. The LGA may further include one or more LGA ground pads, such as LGA ground pads 424 and 426 disposed on the surface of the SOM 404.

In some embodiments, the one or more LGA center anchor pads may be configured to be coupled (e.g., using solder) to one or more MLB center anchor pads, such as MLB center anchor pad 430, disposed on a surface of the MLB 402. In some embodiments, the one or more LGA corner anchor pads may be configured to be coupled (e.g., using solder) to one or more MLB corner anchor pads, such as MLB corner anchor pads 440 and 442, disposed on the surface of the MLB 402. In some embodiments, the one or more LGA digital signal pads (such as LGA digital signal pads 412 and 414) may be configured to be coupled (e.g., using solder) to one or more MLB digital signal pads (such as MLB digital signal pads 432 and 434) disposed on the surface of the MLB 402. In some embodiments, the one or more LGA ground pads (such as LGA ground pads 424 and 426) may be configured to be coupled (e.g., using solder) to one or more MLB ground pads (such as MLB ground pads 444 and 446) disposed on the surface of the MLB 402.

Figure 5:
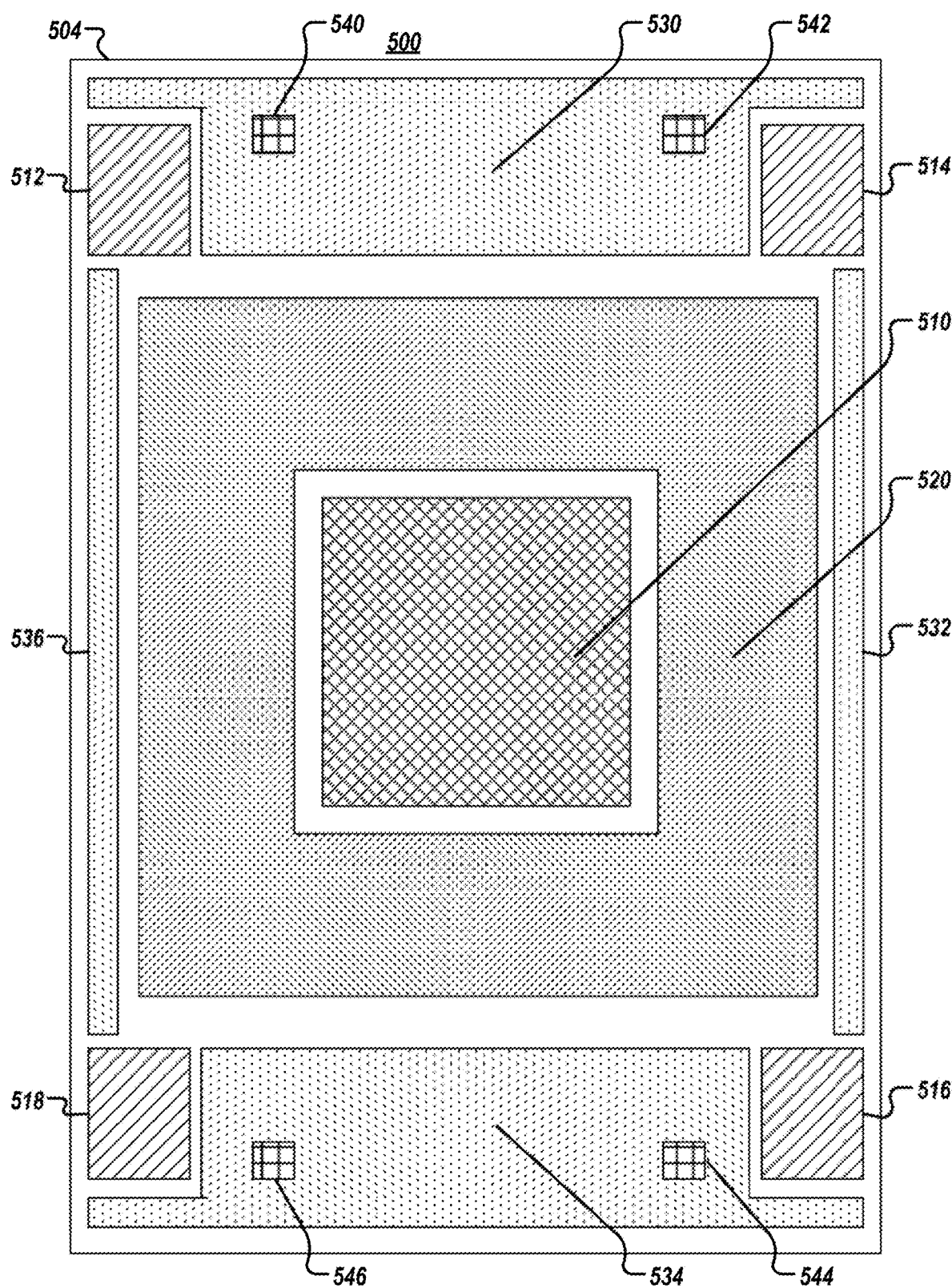
FIG. 5 illustrates an example land grid array (LGA) pattern according to an example embodiment.

FIG. 5 illustrates an example LGA pattern 500 according to an example embodiment. As shown in FIG. 5, a surface of the SOM 504 (sometimes referred to herein as the "second surface" of SOM 504) may comprise an LGA having a rectangular or square footprint. The LGA may include one or more LGA center anchor pads, such as one or more LGA center anchor pads disposed on the surface of the SOM 504 in LGA center anchor pad area 510. In some embodiments, the LGA center anchor pad area 510 may be disposed near or at the center of the SOM 504 (e.g., the center of LGA center anchor pad area 510 may be co-located with, or disposed within about five millimeters of, the center of the SOM 504). In some embodiments, the LGA center anchor pad area 510 may have a footprint of about fifteen millimeters by about fifteen millimeters.

The LGA may further include one or more LGA corner anchor pads, such as LGA corner anchor pads 512, 514, 516, and 518, disposed on the surface of the SOM 504. In some embodiments, the LGA corner pads may be disposed near a perimeter (e.g., within about ten millimeters of the perimeter) of the surface of the SOM 504.

The LGA according to FIG. 5 may further include a digital signal array, such as a digital signal array comprising one or more LGA digital signal pads disposed on the surface of SOM 504 in digital signal array area 520. For example, the LGA may comprise one or more LGA digital signal pads disposed on the second surface of the SOM 504 in digital signal array area 520 between the one or more LGA center anchor pads and the one or more LGA corner anchor pads. The LGA may further include one or more LGA communications pads, such as LGA communications pads 540, 542, 544, and 546, disposed along or near a perimeter (e.g., within about five millimeters of the perimeter) of the surface of the SOM 504. In some embodiments, the one or more communications pads may comprise one or more radio frequency (RF) pads. The LGA may further include one or more LGA ground pads, such as one or more LGA ground pads disposed along or near a perimeter (e.g., within about ten millimeters of the perimeter) of the surface of the SOM 504 in LGA ground pad areas 530, 532, 534, and 536.

In some embodiments according to FIG. 5, the one or more LGA center anchor pads, the one or more LGA corner anchor pads, the one or more LGA digital signal pads, the one or more LGA communications pads, the one or more LGA ground pads, or any combination thereof may be manufactured according to any suitable manufacturing process, such as sputtering, evaporation, etching, chemical vapor deposition (CVD), vacuum, printing, screening, stenciling, patterning, electroplating, electrodeposition, etc.). In some embodiments, the one or more LGA center anchor pads, the one or more LGA corner anchor pads, the one or more LGA digital signal pads, the one or more LGA communications pads, the one or more LGA ground pads, or any combination thereof may comprise one or more electrically conductive elements, such as copper, gold, tin, silver, nickel, vanadium, palladium, titanium, chromium, vanadium, zirconium, and alloys or layers thereof.

Figure 6:
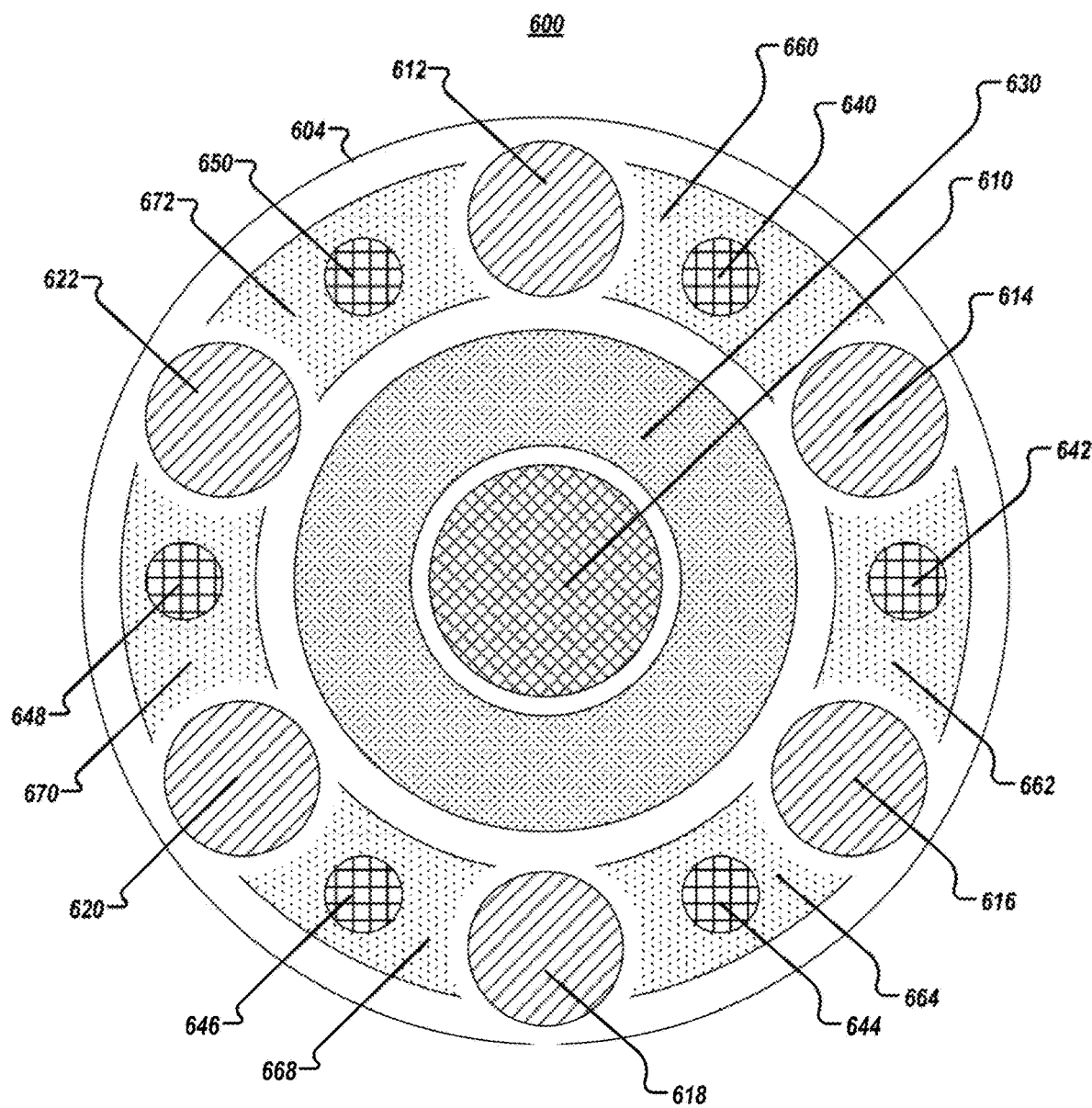
FIG. 6 illustrates an example LGA pattern according to an example embodiment.

FIG. 6 illustrates an example LGA pattern 600 according to an example embodiment. As shown in FIG. 6, a surface of the SOM 604 (sometimes referred to herein as the "second surface" of SOM 604) may comprise an LGA having a non-rectangular footprint (e.g., circular, oval shaped, triangular, diamond, free form, annular or ring shaped, etc.). The LGA may include one or more LGA center anchor pads, such as one or more LGA center anchor pads disposed on the surface of the SOM 604 in LGA center anchor pad area 610. In some embodiments, the LGA center anchor pad area 610 may be disposed near or at the center of the SOM 604 (e.g., the center of LGA center anchor pad area 610 may be co-located with, or disposed within about five millimeters of, the center of the SOM 604). The LGA may further include one or more LGA corner anchor pads, such as LGA corner anchor pads 612, 614, 616, 618, 620, and 622, disposed on the surface of the SOM 604. In some embodiments, the LGA corner pads may be disposed near a perimeter (e.g., within about ten millimeters of the perimeter) of the surface of the SOM 604.

The LGA according to FIG. 6 may further include a digital signal array, such as a digital signal array comprising one or more LGA digital signal pads disposed on the surface of SOM 604 in digital signal array area 630. For example, the LGA may comprise one or more LGA digital signal pads disposed on the surface of the SOM 604 in digital signal array area 630 between the one or more LGA center anchor pads and the one or more LGA corner anchor pads. The LGA may further include one or more LGA communications pads, such as LGA communications pads 640, 642, 644, 646, 648, and 650, disposed along or near a perimeter (e.g., within about five millimeters of the perimeter) of the surface of the SOM 604. In some embodiments, the one or more communications pads may comprise one or more radio frequency (RF) pads. The LGA may further include one or more LGA ground pads, such as one or more LGA ground pads disposed along or near a perimeter (e.g., within about ten millimeters of the perimeter) of the surface of the SOM 604 in LGA ground pad areas 660, 662, 664, 668, 670, and 672.

In some embodiments according to FIG. 6, the one or more LGA center anchor pads, the one or more LGA corner anchor pads, the one or more LGA digital signal pads, the one or more LGA communications pads, the one or more LGA ground pads, or any combination thereof may be manufactured according to any suitable manufacturing process, such as sputtering, evaporation, etching, chemical vapor deposition (CVD), vacuum, printing, screening, stenciling, patterning, electroplating, electrodeposition, etc.). In some embodiments, the one or more LGA center anchor pads, the one or more LGA corner anchor pads, the one or more LGA digital signal pads, the one or more LGA communications pads, the one or more LGA ground pads, or any combination thereof may comprise one or more electrically conductive elements, such as copper, gold, tin, silver, nickel, vanadium, palladium, titanium, chromium, vanadium, zirconium, and alloys or layers thereof.

Figure 7:
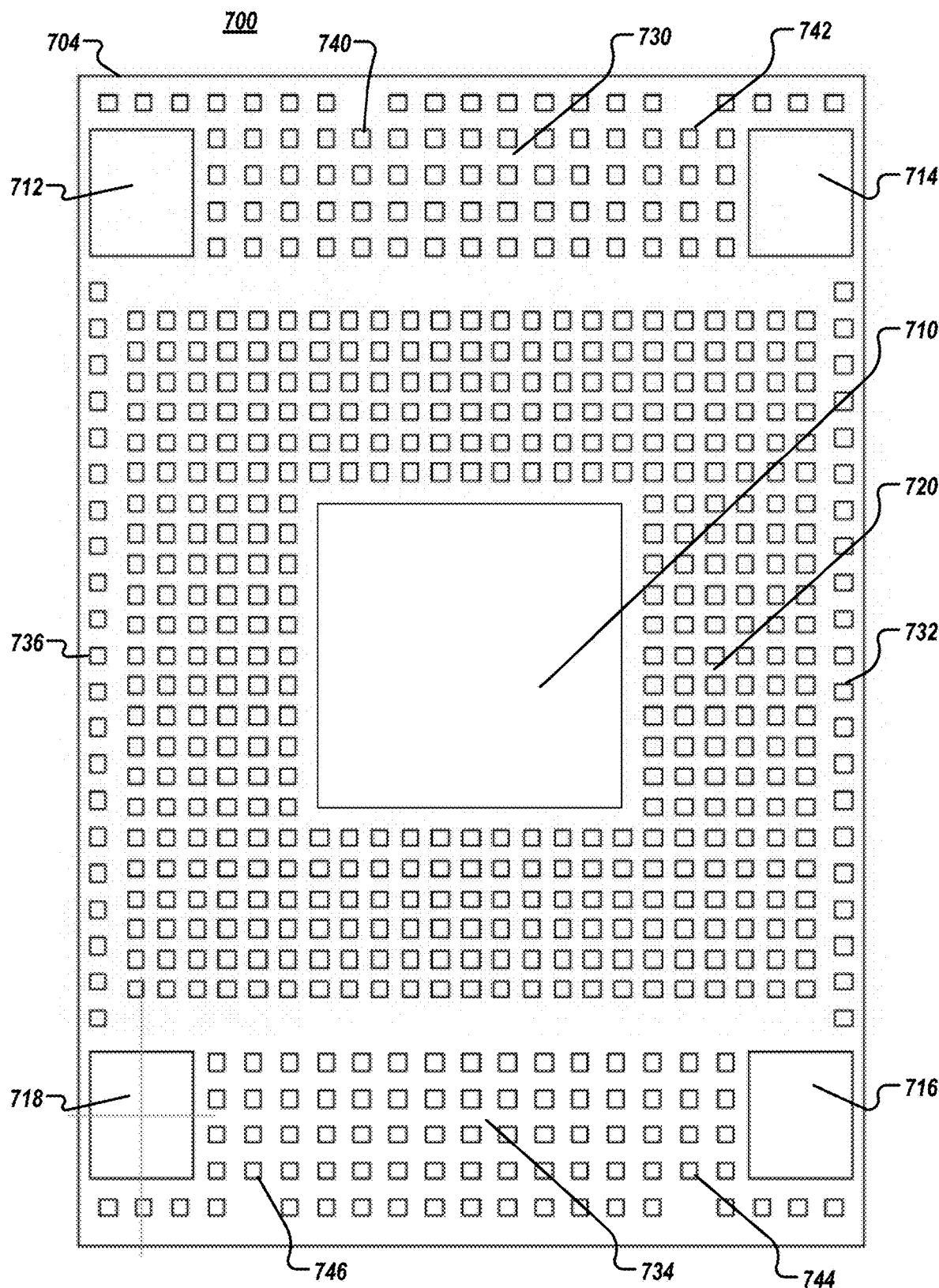
FIG. 7 illustrates an example LGA pattern according to an example embodiment.

FIG. 7 illustrates an example LGA pattern 700 according to an example embodiment. As shown in FIG. 7, a surface of the SOM 704 (sometimes referred to herein as the "second surface" of SOM 704) may comprise an LGA having a rectangular or square footprint. The LGA may include one or more LGA center anchor pads, such as one or more LGA center anchor pads disposed on the surface of the SOM 704 in LGA center anchor pad area 710. In some embodiments, the LGA center anchor pad area 710 may be disposed near or at the center of the SOM 704 (e.g., the center of LGA center anchor pad area 710 may be co-located with, or disposed within about five millimeters of, the center of the SOM 704). In some embodiments, the LGA center anchor pad area 710 may have a footprint of about fifteen millimeters by about fifteen millimeters. The LGA may further include one or more LGA corner anchor pads, such as LGA corner anchor pads 712, 714, 716, and 718, disposed on the surface of the SOM 704. In some embodiments, the LGA corner pads may be disposed near a perimeter (e.g., within about ten millimeters of the perimeter) of the surface of the SOM 704.

The LGA according to FIG. 7 may further include a digital signal array, such as a digital signal array comprising one or more LGA digital signal pads disposed on the surface of SOM 704 in digital signal array area 720. For example, the LGA may comprise one or more LGA digital signal pads disposed on the second surface of the SOM 704 in digital signal array area 720 between the one or more LGA center anchor pads and the one or more LGA corner anchor pads. The LGA may further include one or more LGA communications pads, such as LGA communications pads 740, 742, 744, and 746, disposed along or near a perimeter (e.g., within about five millimeters of the perimeter) of the surface of the SOM 704. In some embodiments, the one or more communications pads may comprise one or more radio frequency (RF) pads. The LGA may further include one or more LGA ground pads, such as one or more LGA ground pads disposed along or near a perimeter (e.g., within about ten millimeters of the perimeter) of the surface of the SOM 704 in LGA ground pad areas 730, 732, 734, and 736. In some embodiments, as shown in FIG. 7, the LGA may not include an LGA ground pad between each of the one or more LGA communications pads and the perimeter of the surface of the SOM 704. This arrangement may increase the signal quality and strength of RF signals transmitted and received by LGA communications pads 740, 742, 744, and 746.

In some embodiments according to FIG. 7, the one or more LGA center anchor pads, the one or more LGA corner anchor pads, the one or more LGA digital signal pads, the one or more LGA communications pads, the one or more LGA ground pads, or any combination thereof may be manufactured according to any suitable manufacturing process, such as sputtering, evaporation, etching, chemical vapor deposition (CVD), vacuum, printing, screening, stenciling, patterning, electroplating, electrodeposition, etc.). In some embodiments, the one or more LGA center anchor pads, the one or more LGA corner anchor pads, the one or more LGA digital signal pads, the one or more LGA communications pads, the one or more LGA ground pads, or any combination thereof may comprise one or more electrically conductive elements, such as copper, gold, tin, silver, nickel, vanadium, palladium, titanium, chromium, vanadium, zirconium, and alloys or layers thereof.

Figure 8A:
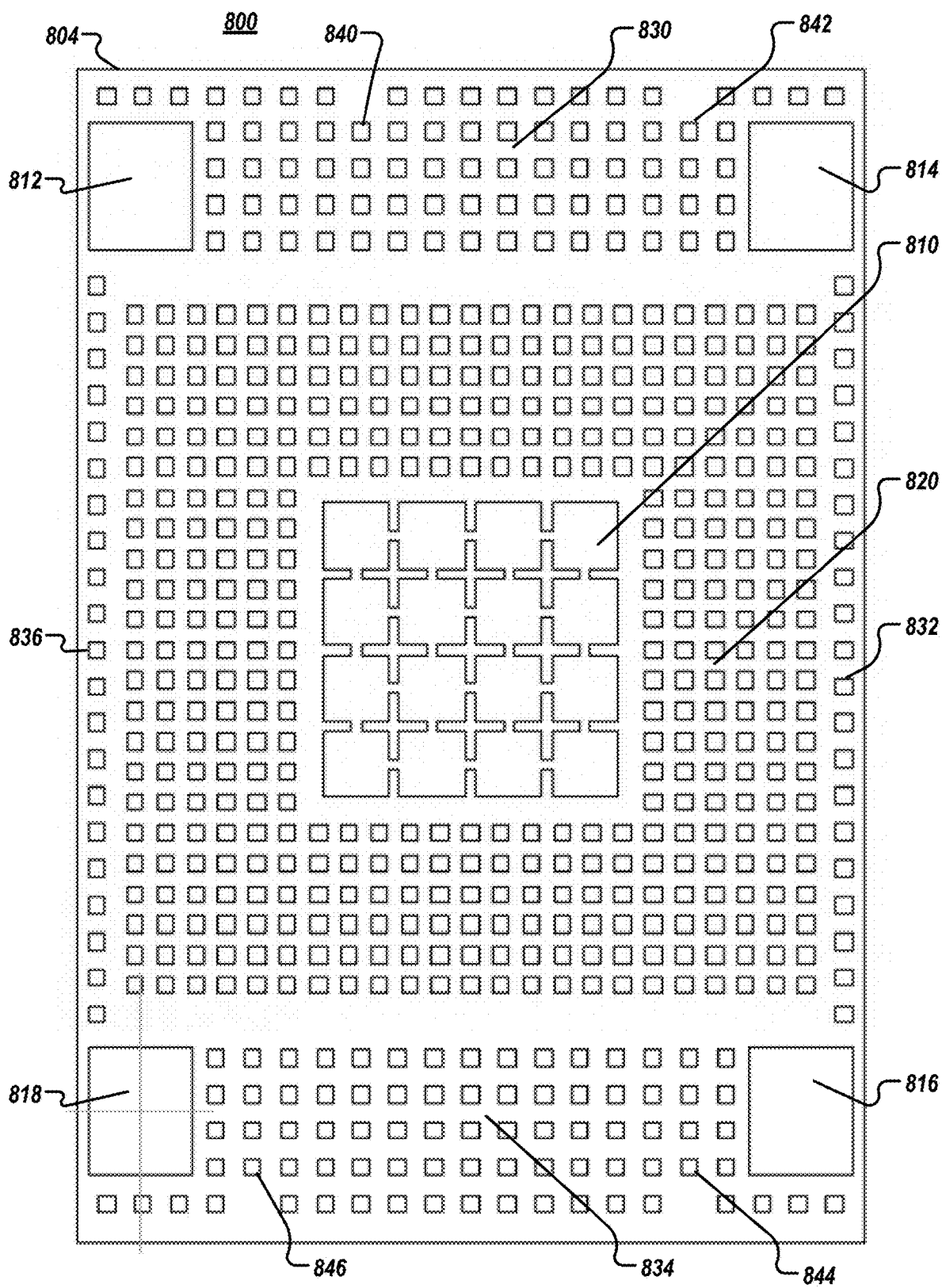
FIGS. 8A and 8B illustrate an example LGA pattern according to example embodiments.
Figure 8B:
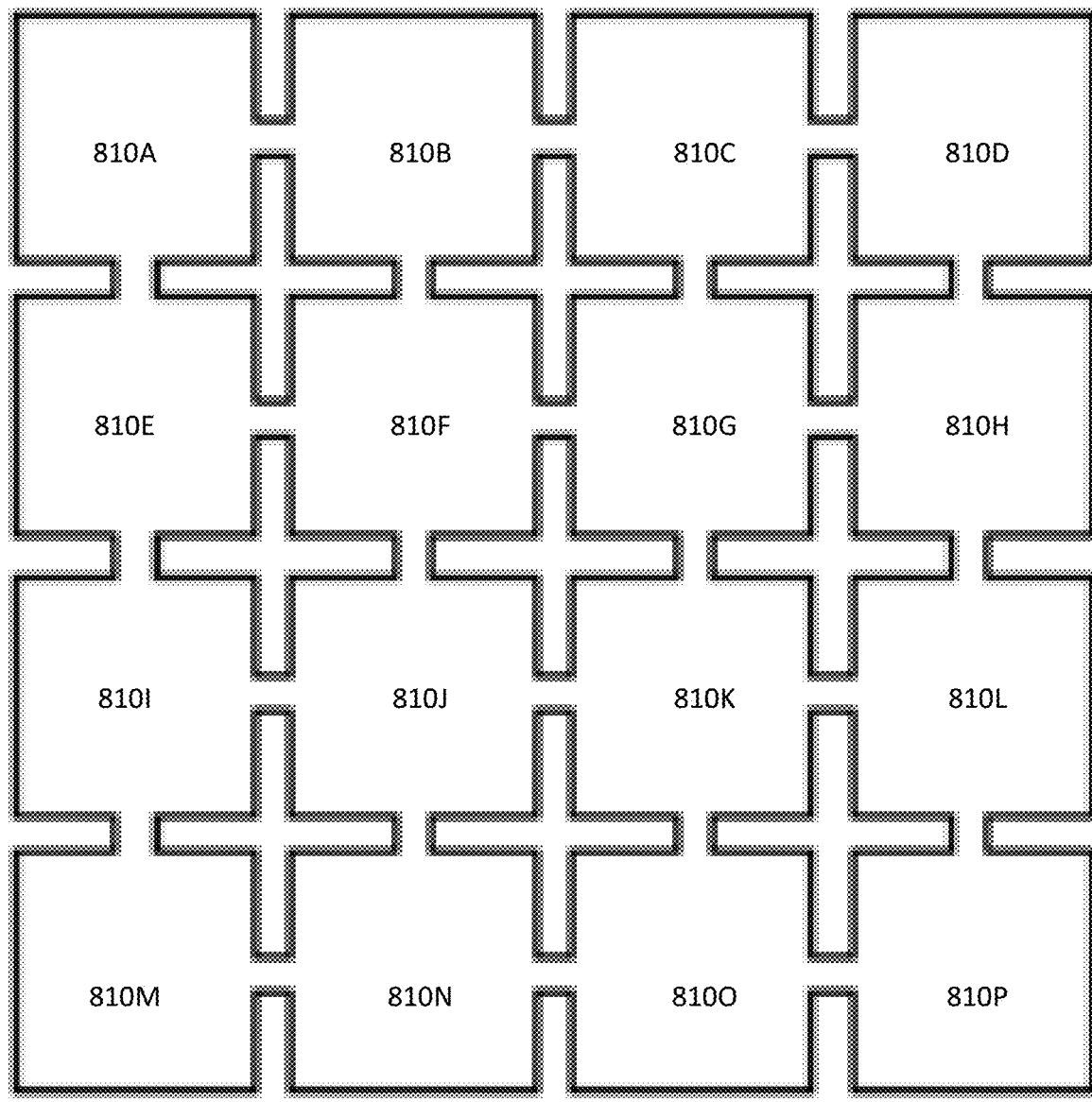

FIGS. 8A and 8B illustrate an example LGA pattern 800 according to example embodiments. As shown in FIG. 8A, a surface of the SOM 804 (sometimes referred to herein as the "second surface" of SOM 804) may comprise an LGA having a rectangular or square footprint. The LGA may include one or more LGA center anchor pads, such as one or more LGA center anchor pads disposed on the surface of the SOM 804 in LGA center anchor pad area 810. In some embodiments, the LGA center anchor pad area 810 may be disposed near or at the center of the SOM 804 (e.g., the center of LGA center anchor pad area 810 may be co-located with, or disposed within about five millimeters of, the center of the SOM 804). In some embodiments, the LGA center anchor pad area 810 may have a footprint of about fifteen millimeters by about fifteen millimeters. For example, the LGA may comprise two or more LGA center anchor pads disposed on the surface of the SOM 404 and one or more LGA electrical channels disposed on the surface of the SOM 404 between the two or more center anchor pads. The two or more center anchor pads may be coupled electrically by the one or more electrical channels. The LGA may further include one or more LGA corner anchor pads, such as LGA corner anchor pads 812, 814, 816, and 818, disposed on the surface of the SOM 804. In some embodiments, the LGA corner pads may be disposed near a perimeter (e.g., within about ten millimeters of the perimeter) of the surface of the SOM 804.

The LGA according to FIG. 8A may further include a digital signal array, such as a digital signal array comprising one or more LGA digital signal pads disposed on the surface of SOM 804 in digital signal array area 820. For example, the LGA may comprise one or more LGA digital signal pads disposed on the second surface of the SOM 804 in digital signal array area 820 between the one or more LGA center anchor pads and the one or more LGA corner anchor pads. In some embodiments, the LGA digital signal pads are disposed around the one or more LGA center anchor pads.

The LGA may further include one or more LGA communications pads, such as LGA communications pads 840, 842, 844, and 846, disposed along or near a perimeter (e.g., within about five millimeters of the perimeter) of the surface of the SOM 804. In some embodiments, the one or more communications pads may comprise one or more radio frequency (RF) pads. The LGA may further include one or more LGA ground pads, such as one or more LGA ground pads disposed along or near a perimeter (e.g., within about ten millimeters of the perimeter) of the surface of the SOM 804 in LGA ground pad areas 830, 832, 834, and 836. In some embodiments, as shown in FIG. 8, the LGA may not include an LGA ground pad between each of the one or more LGA communications pads and the perimeter of the surface of the SOM 804. This arrangement may increase the signal quality and strength of RF signals transmitted and received by LGA communications pads 840, 842, 844, and 846.

In some embodiments according to FIG. 8A, the one or more LGA center anchor pads, the one or more LGA corner anchor pads, the one or more LGA digital signal pads, the one or more LGA communications pads, the one or more LGA ground pads, or any combination thereof may be manufactured according to any suitable PCB manufacturing process, such as sputtering, evaporation, etching, chemical vapor deposition (CVD), vacuum, printing, screening, stenciling, patterning, electroplating, electrodeposition, etc.). In some embodiments, the one or more LGA center anchor pads, the one or more LGA corner anchor pads, the one or more LGA digital signal pads, the one or more LGA communications pads, the one or more LGA ground pads, or any combination thereof may comprise one or more electrically conductive elements, such as copper, gold, tin, silver, nickel, vanadium, palladium, titanium, chromium, vanadium, zirconium, and alloys or layers thereof.

FIG. 8B illustrates the one or more LGA center anchor pads disposed in LGA center anchor pad area 810. The LGA center anchor pad area 810 may include one or more LGA center anchor pads, such as one or more LGA center anchor pads disposed on the surface of the SOM 804 in LGA center anchor pad area 810. For example, the LGA may comprise sixteen LGA center anchor pads, such as LGA center anchor pads 810A, 810B, 810C, 810D, 810E, 810F, 810G, 810H, 810I, 810J, 810K, 810L, 810M, 810N, 8100, and 810P disposed on the surface of the SOM 804. As shown in FIG. 8B, these sixteen LGA center anchor pads are arranged in a 4 by 4 grid, and the center of the grid is at the center of the SOM.

The LGA may further comprise twenty-four LGA electrical channels disposed on the surface of the SOM 804 between the sixteen LGA center anchor pads. The sixteen LGA center anchor pads may be coupled electrically by twenty-four LGA electrical channels. The LGA center anchor pads and LGA electrical channels may be manufactured by any suitable manufacturing process, such as windowing.

Example Method for Implementing Embodiments of the Present Invention

As described above, various embodiments of the present invention may be implemented as methods, apparatus, systems, computing devices, computing entities, and/or the like. For example, embodiments of the present invention may take the form of a method, an entirely computer program product embodiment that causes one or more hardware to perform certain steps or operations of the method, and/or an embodiment that comprises combination of computer program products and hardware performing certain steps or operations of the method.

As will be appreciated, any such computer program instructions and/or other type of code may be loaded onto a computer, processor or other programmable apparatus's circuitry to produce a machine, such that the computer, processor, or other programmable circuitry that execute the code on the machine create the means for implementing various functions, including those described herein. In some embodiments, one or more external systems (such as one or more remote servers, cloud-based servers and/or data storage systems) may also be leveraged to provide at least some of the functionality discussed herein.

1. Example Manufacturing Methods

In some embodiments, the one or more pads of the LGA may be manufactured according to a suitable PCB manufacturing process, such as sputtering, evaporation, etching, chemical vapor deposition (CVD), vacuum, printing, screening, stenciling, patterning, electroplating, electrodeposition, etc.). In some embodiments, the one or more pads of the LGA may comprise one or more electrically conductive elements, such as copper, gold, tin, silver, nickel, vanadium, palladium, titanium, chromium, vanadium, zirconium, and alloys or layers thereof.

Figure 9:
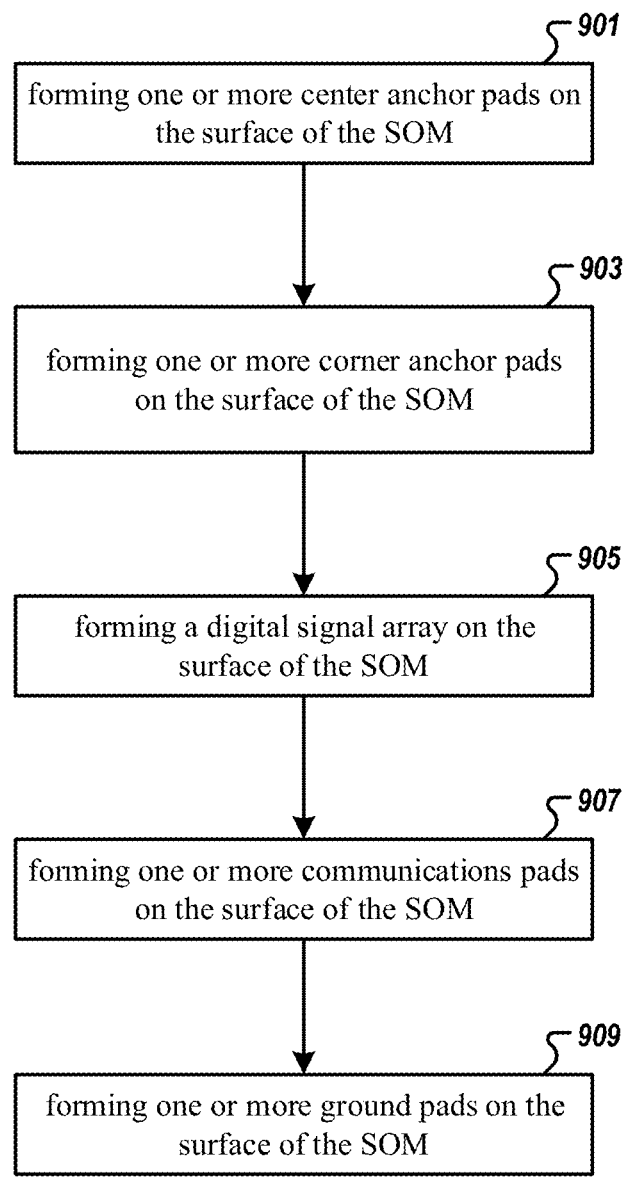
FIG. 9 illustrates an example method of manufacturing an LGA on a surface of an SOM according to an example embodiment.

FIG. 9 illustrates an example method 900 of manufacturing an LGA on a surface of an SOM according to an example embodiment.

At step/operation 901, various embodiments of the present invention provide means for forming one or more center anchor pads on the surface of the SOM. For example, the one or more center anchor pads may be manufactured and formed on the surface of the SOM in accordance of various techniques described above. In another example, computer program instructions and/or other type of code may be loaded onto a computer, processor or other programmable apparatus's circuitry to produce a machine, such that the computer, processor, or other programmable circuitry that execute the code on the machine causes the one or more center anchor pads to be formed on the surface of the SOM through robotic means, such as using a robotic arm to implement various techniques described above. The one or more center anchor pads may be, for example, LGA center anchor pad 410 as shown in FIGS. 4A-4B or LGA center anchor pads 810A-810D as shown in FIGS. 8A-8B.

At step/operation 903, various embodiments of the present invention provide means for forming one or more corner anchor pads on the surface of the SOM. For example, the one or more corner anchor pads may be manufactured and formed on the surface of the SOM in accordance of various techniques described above. In another example, computer program instructions and/or other type of code may be loaded onto a computer, processor or other programmable apparatus's circuitry to produce a machine, such that the computer, processor, or other programmable circuitry that execute the code on the machine causes the one or more corner anchor pads to be formed on the surface of the SOM through robotic means, such as using a robotic arm to implement various techniques described above. The one or more center anchor pads may be, for example, LGA corner anchor pads 420 and 422 as shown in FIGS. 4A-4B, LGA corner anchor pads 512, 514, 516, and 518 as shown in FIG. 5, LGA corner anchor pads 612, 614, 616, 618, 620, and 622 as shown in FIG. 6, LGA corner anchor pads 712, 714, 716, and 718 as shown in FIG. 7, or LGA corner anchor pads 812, 814, 816, and 818 as shown in FIGS. 8A-8B.

At step/operation 905, various embodiments of the present invention provide means for forming a digital signal array on the surface of the SOM. For example, the digital signal array may be manufactured and formed on the surface of the SOM in accordance of various techniques described above. In another example, computer program instructions and/or other type of code may be loaded onto a computer, processor or other programmable apparatus's circuitry to produce a machine, such that the computer, processor, or other programmable circuitry that execute the code on the machine causes the digital signal array to be formed on the surface of the SOM through robotic means, such as using a robotic arm to implement various techniques described above. The digital signal array may be, for example, the digital signal array area 520 as shown in FIG. 5, the digital signal array area 630 as shown in FIG. 6, the digital signal array area 720 as shown in FIG. 7, and the digital signal array area 820 as shown in FIGS. 8A-8B.

At step/operation 907, various embodiments of the present invention provide means for forming one or more communications pads on the surface of the SOM. For example, the one or more communications pads may be manufactured and formed on the surface of the SOM in accordance of various techniques described above. In another example, computer program instructions and/or other type of code may be loaded onto a computer, processor or other programmable apparatus's circuitry to produce a machine, such that the computer, processor, or other programmable circuitry that execute the code on the machine causes the one or more communications pads to be formed on the surface of the SOM through robotic means, such as using a robotic arm to implement various techniques described above. The one or more communications pads may be, for example, LGA communications pads 540, 542, 544, and 546 as shown in FIG. 5, LGA communications pads 640, 642, 644, 646, 648, and 650 as shown in FIG. 6, LGA communications pads 740, 742, 744, and 746 as shown in FIG. 7, and LGA communications pads 840, 842, 844, and 846 as shown in FIGS. 8A-8B.

At step/operation 909, various embodiments of the present invention provide means for forming one or more ground pads on the surface of the SOM. For example, the one or more ground pads may be manufactured and formed on the surface of the SOM in accordance of various techniques described above. In another example, computer program instructions and/or other type of code may be loaded onto a computer, processor or other programmable apparatus's circuitry to produce a machine, such that the computer, processor, or other programmable circuitry that execute the code on the machine causes the one or more ground pads to be formed on the surface of the SOM through robotic means, such as using a robotic arm to implement various techniques described above. The one or more ground pads may be, for example, LGA ground pad areas 530, 532, 534, and 536 as shown in FIG. 5, LGA ground pad areas 660, 662, 664, 668, 670, and 672 as shown in FIG. 6, LGA ground pad areas 730, 732, 734, and 736 as shown in FIG. 7, and LGA ground pad areas 830, 832, 834, and 836 as shown in FIG. 8A-8B.

FIG. 10 illustrates an example method 1000 of manufacturing an MLB according to an example embodiment.

At step/operation 1002, various embodiments of the present invention provide means for forming one or more MLB center anchor pads on a first surface of the MLB, wherein the one or more MLB center anchor pads are configured to be coupled to one or more LGA center anchor pads disposed on a second surface of an SOM. For example, the one or more MLB center anchor pads may be manufactured, formed, and coupled to the one or more LGA center anchor pads in accordance of various techniques described above in connection with FIGS. 4A-8B.

At step/operation 1004, various embodiments of the present invention provide means for forming one or more MLB corner anchor pads on the first surface of the MLB, wherein the one or more MLB corner anchor pads are configured to be coupled to one or more LGA corner anchor pads disposed on the second surface of the SOM. For example, the one or more MLB corner anchor pads may be manufactured, formed, and coupled to the one or more LGA corner anchor pads in accordance of various techniques described above in connection with FIGS. 4A-8B.

At step/operation 1006, various embodiments of the present invention provide means for forming one or more MLB digital signal pads on the first surface of the MLB, wherein the one or more MLB digital signal pads are configured to be coupled to one or more LGA digital signal pads disposed on the second surface of the SOM. For example, the one or more MLB digital signal pads may be manufactured, formed, and coupled to the one or more LGA digital signal pads in accordance of various techniques described above in connection with FIGS. 4A-8B.

At step/operation 1008, various embodiments of the present invention provide means for forming one or more MLB communications pads on the first surface of the MLB, wherein the one or more MLB communications pads are configured to be coupled to one or more LGA communications pads disposed on the second surface of the SOM. For example, the one or more MLB communications pads may be manufactured, formed, and coupled to the one or more LGA communications pads in accordance of various techniques described above in connection with FIGS. 4A-8B.

At step/operation 1010, various embodiments of the present invention provide means for forming one or more MLB ground pads on the first surface of the MLB, wherein the one or more MLB ground pads are configured to be coupled to one or more LGA ground pads disposed on the second surface of the SOM. For example, the one or more MLB ground pads may be manufactured, formed, and coupled to the one or more LGA ground pads in accordance of various techniques described above in connection with FIGS. 4A-8B.

Figure 11:
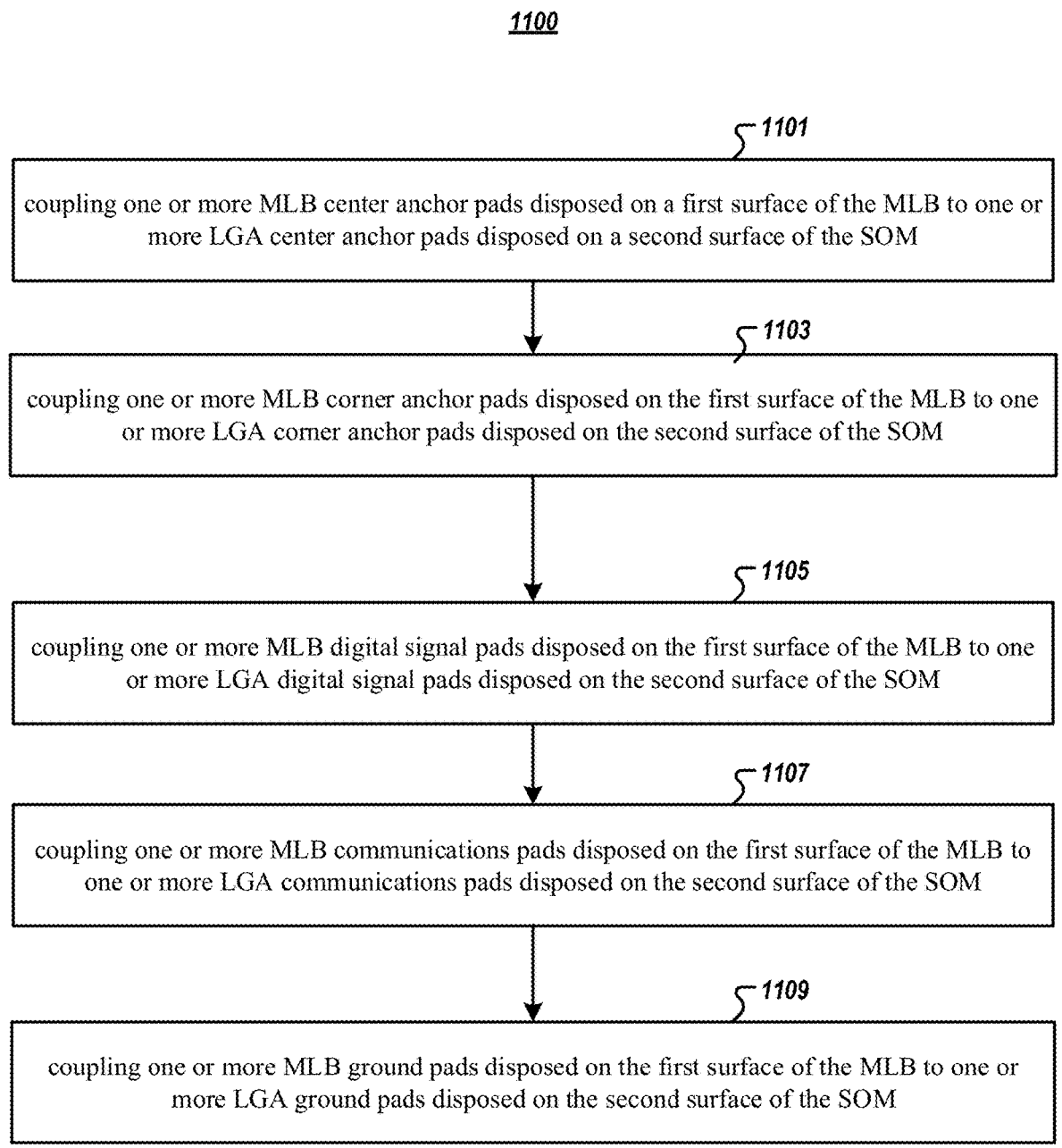
FIG. 11 illustrates an example method of manufacturing a mobile computing device comprising an MLB and an SOM according to an example embodiment.

FIG. 11 illustrates an example method 1100 of manufacturing a mobile computing device comprising an MLB and an SOM according to an example embodiment.

At step/operation 1101, various embodiments of the present invention provide means for coupling one or more MLB center anchor pads disposed on a first surface of the MLB to one or more LGA center anchor pads disposed on a second surface of the SOM. For example, the one or more MLB center anchor pads may be coupled to the one or more LGA center anchor pads in accordance of various techniques described above in connection with FIGS. 4A-8B.

At step/operation 1103, various embodiments of the present invention provide means for coupling one or more MLB corner anchor pads disposed on the first surface of the MLB to one or more LGA corner anchor pads disposed on the second surface of the SOM. For example, the one or more MLB corner anchor pads may be coupled to the one or more LGA corner anchor pads in accordance of various techniques described above in connection with FIGS. 4A-8B.

At step/operation 1105, various embodiments of the present invention provide means for coupling one or more MLB digital signal pads disposed on the first surface of the MLB to one or more LGA digital signal pads disposed on the second surface of the SOM. For example, the one or more MLB digital signal pads may be coupled to the one or more LGA digital signal pads in accordance of various techniques described above in connection with FIGS. 4A-8B.

At step/operation 1107, various embodiments of the present invention provide means for coupling one or more MLB communications pads disposed on the first surface of the MLB to one or more LGA communications pads disposed on the second surface of the SOM. For example, the one or more MLB communications pads may be coupled to the one or more LGA communications pads in accordance of various techniques described above in connection with FIGS. 4A-8B.

At step/operation 1109, various embodiments of the present invention provide means for coupling one or more MLB ground pads disposed on the first surface of the MLB to one or more LGA ground pads disposed on the second surface of the SOM. For example, the one or more MLB ground pads may be coupled to the one or more LGA ground pads in accordance of various techniques described above in connection with FIGS. 4A-8B.

2. Example Testing Methods

As described above, the LGA with SOM in accordanceq with various embodiments of the present invention reduces at least the following potential risks: open connections due to vibe/drop/tumble and loss of RF signal integrity across the LGA interface. In some example embodiments, various example testing methods may assist in evaluating the LGA SOM characteristics.

(a) Mechanical Evaluation Board

In some embodiments, example MLBs connected to one or more SOMs with LGAs in accordance with present invention ("mechanical evaluation board") may undergo mechanical, electrical, environmental tests.

Figure 12:
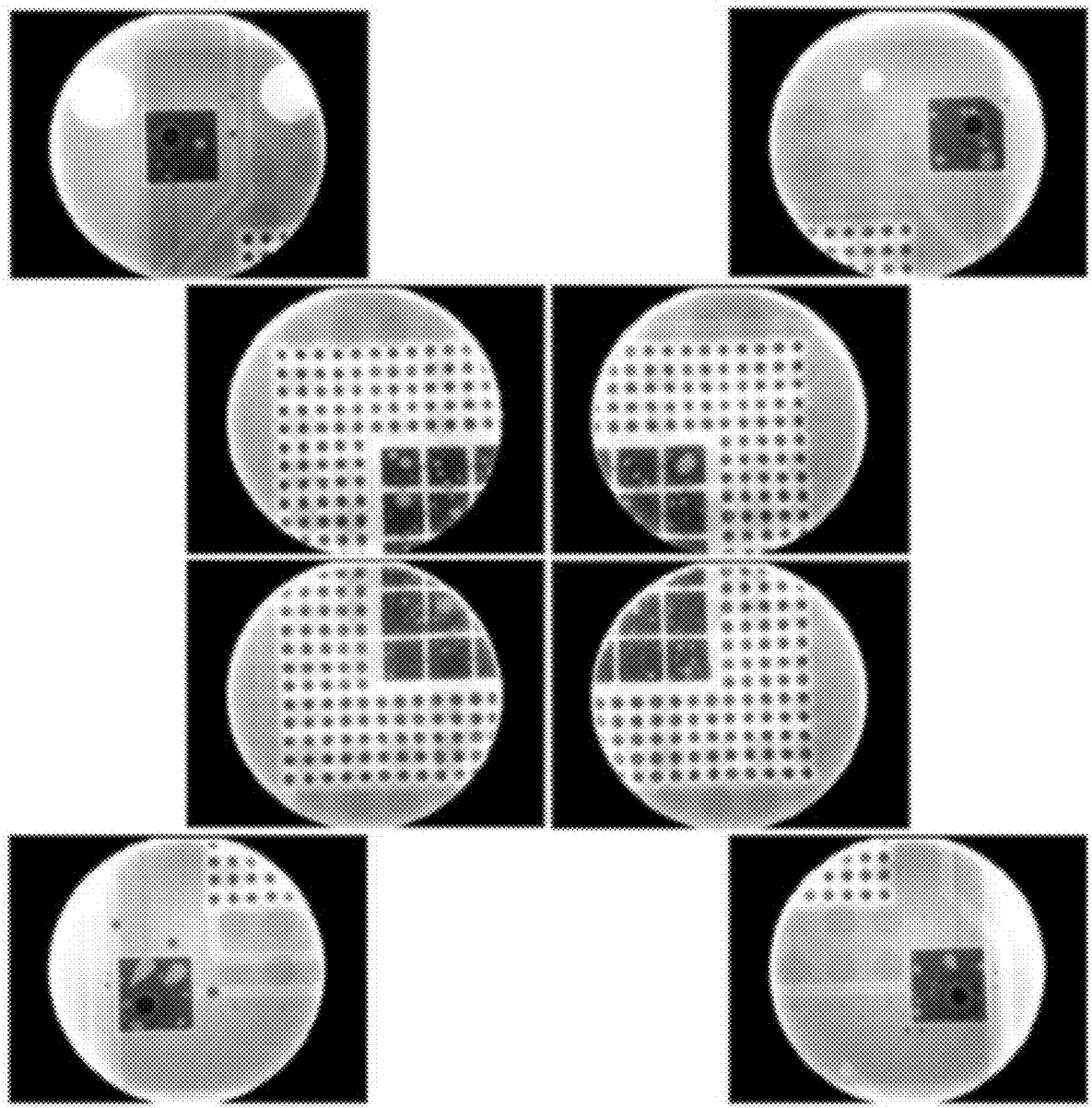
FIG. 12 illustrates x-ray images of portions of an example SOM connected to an example MLB for use in a mobile computing device according to an example embodiment.

In some example embodiments, the mechanical evaluation boards may include the following characteristics: (1) each mechanical evaluation board has a size of 1.9×2.5 inches using LGA attachment; (2) all signals in each mechanical evaluation board are monitored across zones around center anchor pad; (3) opens as brief as 10 ns are latched and indicated via LED installed on the mechanical evaluation board; and (4) weights were bonded to each SOM to simulate weight of chipsets. In some embodiments, the mechanical evaluation boards used in the mechanical, electrical, environmental tests are assembled with 6 mil solder paste and 1.5 mil spacer tape (Kapton). FIG. 12 shows the x-ray images 1200 of an example mechanical evaluation board in accordance with some embodiments. As shown in FIG. 12, some voiding exist.

In some embodiments, the LGA may have a size of 2.2 inches by 2.2 inches (560×560 mm). In some examples embodiments, the SOM and MLB of the mechanical evaluation board shares the same stack-up.

In some example embodiments, the mechanical evaluations boards may be built into mobile computing device housings for the purpose of drop, tumble and vibration testing. In some example embodiments, these units may be powered via flying leads to eliminate any power disruption.

In some example embodiments, the testing results of several mechanical evaluation board units may be summarized as follows:

TABLE 4

Testing Results Of The Mechanical Evaluation Boards

| Test | Condition | Result |
| --- | --- | --- |
| Drop Testing | 5 feet, 6 faces, in mobile computing device housings | units failed at 84, 60, 134, and 304 drops; in 3 of the units, the open occurred on the corner anchor pads (i.e., a real world device would have continued to function properly) |
| Tumble Testing | 1 m drop, in mobile computing device housings | 1 of the 4 units failed at 3300 tumbles; the other 3 never failed; that failure occurred on a corner anchor pad |
| Vibration Testing | | 3 board sets tested with no failures |

As shown above, the testing results indicate that the mechanical evaluation boards in accordance with the present invention protect the signal pads from breaking contact when dropped, shocked, or vibrated.

Further, based on the analysis of the test results, the board flatness on the order of 0.2 percent or better is recommended for consistent solder joints while attaching SOM modules that are 2.0 inches or over is any direction. The spacing between the SOM module and its associated MLB must be controlled via a spacing mechanism to insure the solder paste is not crushed due to the SOM weight during reflow or the process of placement. Board-to-board (SOM to MLB) spacing of 0.0015-0.0025 inches using 6 mil solder paste provides a good workable combination. Pins should be pre-soldered to the SOM PCB into non-plated through holes. The preferred solder voiding is 25 percent or less, and it is hard to reduce to zero due to the small board-to-board gap and gas trapping.

(b) RF Evaluation Board

In some embodiments, example MLBs connected to one or more SOMs with LGAs in accordance with present invention may undergo radio frequency (RF) and high speed digital tests.

In some example embodiments, the evaluation of the RF evaluation boards may include the following considerations: (1) includes several representative traces (RF transmission lines) in each RF evaluation board covering possible transitions between SOM and MLB; (2) simulate each RF evaluation board using EM simulation tools (such as Ansys HFSS and CST Microwave Studio), and (3) measure, compare, and analyze data related to S-parameters.

Some of the design considerations for the RF evaluation boards include: (1) inner ground layers may be cleared from under the RF traces, allowing to effectively use thicker dielectric layer (almost full board thickness); (2) microstrip trace width equals to 1 mm; (3) trace impedance may be adjusted for transition between open air and portion sandwiched between MLB and SOM (going from 1 mm wide to 0.6 mm wide); (4) exposed ground contacts may be added around RF signal pads on each board; (5) CST simulations may include the connector landing pattern and connector body itself; and (6) RF via signal pad diameter equals to 1 mm.

In some embodiments, the SOM and MLB may include four RF traces: (1) from the top surface of SOM to the top surface of MLB, without passing through SOM (REFERENCE SOM-TOP>MLB-TOP); (2) from the top surface of SOM to the top surface of MLB, passing through SOM (SOM-TOP>MLB-TOP); (3) from the top surface of SOM to the top surface of MLB, passing through SOM (SOM-TOP>MLB-BOT); and (4) from the top surface of SOM to the top surface of MLB, without passing through SOM (REFERENCE SOM-TOP>MLB-BOT).

In some example embodiments, the testing results of several RF evaluation board units show RF performance (through loss) up to 6 dB was within 1 dB of simulations for reference traces up to 6 GHz. The effect of the LGA interface is much less than 0.5 dB for frequencies below 3 GHz. Between 3 and 6 GHz, the LGA interface affects the signal, but mostly less than 1 dB. As such, the testing results indicate that the RF evaluation boards in accordance with the present invention allow for good signal integrity for the high frequency RF signals.

Additional Implementation Details

Furthermore, any advantages and features described above may relate to specific embodiments, but shall not limit the application of such issued claims to processes and structures accomplishing any or all of the above advantages or having any or all of the above features.

In addition, the section headings used herein are provided for consistency with the suggestions under 37 C.F.R. 1.77 or to otherwise provide organizational cues. These headings shall not limit or characterize the disclosure set out in any claims that may issue from this disclosure. For instance, a description of a technology in the "Background" is not to be construed as an admission that certain technology is prior art to any disclosure in this disclosure. Neither is the "Summary" to be considered as a limiting characterization of the disclosure set forth in issued claims. Furthermore, any reference in this disclosure to "disclosure" or "embodiment" in the singular should not be used to argue that there is only a single point of novelty in this disclosure. Multiple embodiments of the present disclosure may be set forth according to the limitations of the multiple claims issuing from this disclosure, and such claims accordingly define the disclosure, and their equivalents, that are protected thereby. In all instances, the scope of the claims shall be considered on their own merits in light of this disclosure, but should not be constrained by the headings set forth herein.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the scope disclosed herein.

Many modifications and other embodiments of the disclosure set forth herein will come to mind to one skilled in the art to which these embodiments pertain having the benefit of teachings presented in the foregoing descriptions and the associated figures. Although the figures only show certain components of the apparatus and systems described herein, it is understood that various other components may be used in conjunction. Therefore, it is to be understood that the disclosure is not to be limited to the specific embodiments disclosed and that modifications and other embodiments are intended to be included within the scope of the appended claims. For example, the various elements or components may be combined or integrated in another system or certain features may be omitted or not implemented. Moreover, the steps in any method described above may not necessarily occur in the order depicted in the accompanying diagrams, and in some cases one or more of the steps depicted may occur substantially simultaneously, or additional steps may be involved. Although specific terms are employed herein, they are used in a generic and descriptive sense only and not for purposes of limitation.

The invention claimed is:

1. A circuit board comprising:
a first surface electrically couplable to one or more chipsets;
a second surface comprising a land grid array (LGA), wherein the LGA comprises:
a plurality of center anchor pads disposed on the second surface of the circuit board, a communication pad disposed on the second surface of the circuit board, and a ground pad disposed on the second surface of the circuit board.

2. The circuit board of claim 1,
wherein an electrical channel is disposed on the second surface of the circuit board between a pair of center anchor pads of the plurality of center anchor pads, wherein the electrical channel electrically couples the pair of center anchor pads of the plurality of center anchor pads.

3. The circuit board of claim 1,
wherein the plurality of center anchor pads comprise sixteen center anchor pads arrayed in a 4×4 grid in an XY plane formed by the circuit board; and
wherein the circuit board further comprises twenty-four electrical channels disposed on the second surface of the circuit board between the sixteen center anchor pads, with an electrical channel between each neighboring center anchor pad in an x-axis direction and y-axis direction, wherein the sixteen center anchor pads are coupled electrically by the twenty-four electrical channels.

4. The circuit board of claim 3, wherein a center of the 4×4 grid is at a center of the circuit board.

5. The circuit board of claim 1, wherein the LGA further comprises a digital signal array, wherein the digital signal array comprises one or more digital signal pads disposed on the second surface of the circuit board between one or more center anchor pads of the plurality of center anchor pads and a corner anchor pad.

6. The circuit board of claim 5, wherein the one or more digital signal pads are disposed around the one or more center anchor pads of the plurality of center anchor pads.

7. The circuit board of claim 1, wherein the circuit board further comprises one or more radio frequency (RF) pads disposed on the second surface of the circuit board along a perimeter of the second surface of the circuit board.

8. The circuit board of claim 1, wherein the ground pad is further disposed along a perimeter of the second surface of the circuit board.

9. The circuit board of claim 1,
wherein each of the plurality of center anchor pads is couplable to a respective one of a plurality of main logic board (MLB) center anchor pads disposed on a surface of the MLB,
wherein a corner anchor pad is couplable to a MLB corner anchor pad disposed on the surface of the MLB,
wherein the communication pad is couplable to a MLB communication pad disposed on the surface of the MLB, and
wherein the ground pad is couplable to a MLB ground pad disposed on the surface of the MLB.

10. A system for providing a modular electronics platform for a mobile computing device, the system comprising:
a circuit board comprising a first surface electrically couplable to one or more chipsets and a second surface comprising a land grid array (LGA) disposed on the second surface, wherein the LGA comprises a plurality of LGA center anchor pads disposed on the second surface of the circuit board, an LGA corner anchor pad disposed on the second surface of the circuit board, an LGA digital signal pad disposed on the second surface of the circuit board, an LGA communication pad disposed on the second surface of the circuit board; and
a main logic board (MLB) comprising:
an MLB surface,
a plurality of MLB center anchor pads disposed on the MLB surface, wherein each of the plurality of MLB center anchor pads is couplable to a respective one of the plurality of LGA center anchor pads, an MLB corner anchor pad disposed on the MLB surface that is couplable to the LGA corner anchor pad, an MLB digital signal pad disposed on the MLB surface that is couplable to the LGA digital signal pad, an MLB communication pad disposed on the MLB surface that is couplable to the LGA communication pad, and an MLB ground pad disposed on the MLB surface and couplable to an LGA ground pad.

11. The system of claim 10, wherein each of the plurality of MLB center anchor pads is coupled mechanically to a respective one of the plurality of LGA center anchor pads by solder paste.

12. The system of claim 10, wherein:

an electrical channel is disposed on the second surface of the circuit board between a pair of LGA center anchor pads of the plurality of LGA center anchor pads, wherein the electrical channel electrically couples the pair of LGA center anchor pads of the plurality of LGA center anchor pads.

13. The system of claim 10, wherein the plurality of LGA center anchor pads comprise sixteen LGA center anchor pads arrayed in a 4×4 grid in an XY plane formed by the circuit board; and wherein the circuit board further comprises twenty-four electrical channels disposed on the second surface of the circuit board between the sixteen LGA center anchor pads, with an electrical channel between each neighboring LGA center anchor pad in an x-axis direction and y-axis direction, wherein the sixteen LGA center anchor pads are coupled electrically by the twenty-four electrical channels.

14. The system of claim 13, wherein a center of the 4×4 grid is at a center of the circuit board.

15. The system of claim 10, wherein the LGA digital signal pad is disposed on the second surface of the circuit board between a LGA center anchor pad of the plurality of LGA center anchor pads and the LGA corner anchor pad.

16. The system of claim 15, wherein each of the plurality of LGA digital signal pads is disposed around the LGA center anchor pad.

17. The system of claim 10, wherein the circuit board further comprises:

one or more LGA radio frequency (RF) pads disposed on the second surface of the circuit board along a perimeter of the second surface of the circuit board.

18. The system of claim 10, wherein the LGA ground pad is further disposed along a perimeter of the second surface of the circuit board.

19. A method of manufacturing a main logic board (MLB), the method comprising:

forming an MLB center anchor pad on a first surface of the MLB, wherein the MLB center anchor pad is couplable to a land grid array (LGA) center anchor pad disposed on a second surface of a circuit board;

forming a MLB corner anchor pad on the first surface of the MLB, wherein the MLB corner anchor pad is couplable to an LGA corner anchor pad disposed on the second surface of the circuit board; and forming an MLB digital signal pad on the first surface of the MLB, wherein the MLB digital signal pad is couplable to an LGA digital signal pad disposed on the second surface of the circuit board.

20. The method of claim 19, further comprising:

forming an MLB communication pad on the first surface of the MLB, wherein the MLB communication pad is couplable to an LGA communication pad disposed on the second surface of the circuit board; and forming an MLB ground pad on the first surface of the MLB, wherein the MLB ground pad is couplable to an LGA ground pad disposed on the second surface of the circuit board.

\* \* \* \* \*